United States Patent
Will

[11] Patent Number: 6,075,924
[45] Date of Patent: Jun. 13, 2000

[54] INTELLIGENT MOTION SURFACE

[75] Inventor: Peter Will, Los Altos Hills, Calif.

[73] Assignee: University of Southern California, Los Angeles, Calif.

[21] Appl. No.: 08/372,301

[22] Filed: Jan. 13, 1995

[51] Int. Cl.[7] .............................................. G05B 19/042
[52] U.S. Cl. .............................................. 395/95; 395/82
[58] Field of Search ................... 395/95, 80, 84, 395/82, 83, 89

[56] References Cited

U.S. PATENT DOCUMENTS

| | | | |
|---|---|---|---|
| 3,279,863 | 10/1966 | Bouladon et al. | 302/29 |
| 3,656,075 | 4/1972 | Ioffe | 335/219 |
| 3,976,330 | 8/1976 | Babinski et al. | 406/84 |
| 4,123,113 | 10/1978 | Koss | 406/88 |
| 4,165,132 | 8/1979 | Hassan et al. | 406/10 |
| 4,211,505 | 7/1980 | Babinski et al. | 406/19 |
| 4,399,675 | 8/1983 | Erdmann et al. | 72/37 |
| 4,505,166 | 3/1985 | Tesar | 74/469 |
| 4,608,525 | 8/1986 | Mori et al. | 395/84 |
| 4,618,292 | 10/1986 | Judge et al. | 406/19 |
| 4,759,775 | 7/1988 | Peterson et al. | 210/708 |
| 4,761,588 | 8/1988 | Youcef-Toumi et al. | 318/46 |
| 4,874,273 | 10/1989 | Tokisue et al. | 406/88 |
| 5,078,357 | 1/1992 | Mosetich | 248/405 |
| 5,099,216 | 3/1992 | Pelrine | 335/220 |
| 5,179,499 | 1/1993 | MacDonald et al. | 361/313 |
| 5,206,557 | 4/1993 | Bobbio | 310/309 |
| 5,290,400 | 3/1994 | Bobbio | 216/13 |
| 5,331,236 | 7/1994 | Sexton | 310/42 |
| 5,452,568 | 9/1995 | Tisma | 53/579 |
| 5,485,546 | 1/1996 | Rubenstein et al. | 706/25 |
| 5,500,493 | 3/1996 | Gulgne et al. | 367/191 |

Primary Examiner—Robert W. Downs
Attorney, Agent, or Firm—Oppenheimer Wolff & Donnelly LLP

[57] ABSTRACT

The intelligent motion surface disclosed herein includes multiple cells, each cell having independently controllable force producing devices for moving the object in multiple directions parallel to the intelligent motion surface. The intelligent motion surface has within each cell a set of driving devices engaging with the force producing devices for independent operation. Each driving device propels the motion surface in a separate direction. A motion controller independently operates each of the force producing devices to move the object. The motion controller delineates at least one force area on the intelligent motion surface based on object shape, object size, and desired position of the object on the intelligent motion surface, and provides translation of the desired force areas to produce a desired force vector on the intelligent motion surface. The invention contemplates application in a variety of scenarios, and thus the controllability of the surface to move any type of stable object over the surface to attain a desired position and orientation is disclosed.

44 Claims, 22 Drawing Sheets

INTELLIGENT MOTION SURFACE

FIELD OF THE INVENTION

This invention relates to manipulating, feeding, and orienting objects, or more specifically, to programmable surfaces having the capability to translate, rotate, filter, and/or select objects and control their movement over the surface.

BACKGROUND OF THE INVENTION

Typical manufacturing duties in an automated manufacturing environment include translating or rotating a piece for assembly, cutting, wire bonding, or some other necessary process. Many manufacturing applications currently utilize either physical positioning of the piece or object requiring human interaction, or some type of pick-and-place device or robot manipulation device. Other manufacturing applications use a mechanical evaluation setup, or transportation devices, to verify orientation of an object before the object is passed to a subsequent location.

For micro-device applications and some larger industrial applications, human interface and evaluation is commonly employed to verify correct orientation of the work piece. Human interface requires time and effort on the part of an operator which could be directed elsewhere.

Currently, chips used in microdevices, such as multi-chip modules (MCMs), opto-electronic integrated circuits (OEICs) and implantable medical devices, can generally be loaded in a particular orientation. These objects are then placed in the correct location by pick-and-place machines. Some micro-device applications use special automatic orienting and feeding mechanisms to align the pieces for the necessary task. These orienting and feeding mechanisms properly orient the target piece for only a single task, and improper orientation which occasionally occurs can cause problems.

Physical positioning mechanisms, or "pick-and-place" devices simply repeat the same task over and over. If a piece is incorrectly sized or positioned, the pick-and-place mechanism will not operate properly. Hence, pick-and-place devices usually require additional apparatus to ensure that the work piece is the proper size, in the proper orientation, and in the proper orientation before the pick-and place mechanism performs the requisite function.

Robots may or may not have sensory feedback capability, and a robot without sensory capability is essentially the same as a pick-and-place device. Robots having sensors can detect improper sizing, orientation, or placement, but require expensive programs for proper application and reprogramming when the application is changed. Further, robots are large devices relative to the part which require intricate control capability, and they may damage delicate pieces, such as micro-devices or microcircuits. Automation notwithstanding, the necessity for human supervision makes these systems relatively costly and operator intensive.

Other automated positioning systems use feeder bowls or other special arrangements, such as "chutes" to filter parts through a passageway, or obstructions mounted on the side of translation paths to correct the position or orientation of the target part. These devices are relatively simple, may occasionally produce errant results, and cannot be easily changed if the necessary task changes.

Larger applications of orientation and manipulation of objects is illustrated in limited translational devices using air currents, and combined translational and rotational devices again using air as the force modality. Several air current translation and rotation devices use a position evaluating device, such as a light beam, to determine when the object has attained a desired position or orientation.

Airflow prior art may be illustrated by example. U.S. Pat. No. 3,279,863 to Bouladon, et al., illustrates an air layer transporter, resembling the common "air hockey" game played by children. No variable control over the direction of the flow of air is provided. The airflow, position and transportation direction of the object are essentially fixed. The system has four different types of valves providing force in different directions, but the orientation of air flow is fixed so as to move the object in a single direction over the surface. Universal control is unavailable, only specific, predetermined control of the direction of the object.

Various schemes involving light, back pressure, vision, etc. are available to control the stopping and starting of the sequence of such air-based surfaces. Judge et al., U.S. Pat. No. 4,618,292, presents one such example. Judge et al. illustrates a controlled positioning system which requires an electro-optic sensing device for proper operation. Judge shows a wafer having a specific shape, a circle with a notch cut therein, and provides a system for centering and orienting the wafer using a position sensing device, namely an electro-optic control arm. In order to work properly, the system requires the object to be in the shape of a notched circular wafer, and could not work with, for example, triangular or square pieces. Further, the system only provides orientation and positioning capability, not translational capability.

The need has arisen for manipulation, including translation and rotation of small pieces such as microdevices, within an automated manufacturing environment which allows proper orientation of the small piece. Many applications may vary depending on the piece manufactured or the process undertaken, so alteration of the controlled path of the system, not shown in the prior art, would greatly enhance system capability. For example, if a part for a system must be rotated for orientation in a particular direction, then passed to a subsequent location, the ability to alter the surface to perform some new function, such as moving the object to a new location in a different orientation, would be beneficial if the user desires to alter the procedure used at the subsequent location, i.e. if the device is to act as a programmable feeder and orienting device.

The size of the object dictates the means of transporting the object across the surface. Thus, a controllable motion surface should be operable for small as well as large objects, ranging from microns to meters, wherein the objects are of various shapes and the technology to transfer the object varies to suit the part and the application.

Accordingly, it is a principal object of this invention to develop a system which provides controllability over the position of an object on a surface. The invention must control a part presented in random orientation and translate and orient the part to a desired location, and provide flexible control able to change tasks relatively instantaneously.

SUMMARY OF THE INVENTION

In accordance with the current invention, there is provided an intelligent motion surface having a large number of controllable force producing devices disposed over the motion surface to move, orient, hold, manipulate, and feed objects of any size. The application domain includes microdevices as well as industrial applications for sheet glass, packages, automobile parts, and other objects. Assembly using this method will show an increase in throughput and in the quality of the product compared to the current human assembly techniques which are fraught with difficulties at small geometric scale. Unlike the traditional pick and place method, the intelligent motion surface can orient and align the component parts in parallel to speed up the assembly work.

The surface of the array becomes "intelligent" when the control system is installed so that the operations of the unit manipulators are programmable; i.e. the various manipulations from a two-dimensional force field can provide the ability to perform different functions to translate, rotate, or sort parts to destination positions for the assembly purpose. The assembly jobs can be scheduled by calling sequences of basic functions.

The intelligent motion surface of the current invention has a motion controller for independently operating driving devices and force producing devices to move one or more objects in a path parallel to the intelligent motion surface. The motion controller consists of means for delineating at least one force area on the intelligent motion surface based on object shape, object size, and desired position of the object on the intelligent motion surface, and programming means for translating the force areas delineated so as to produce a desired force vector over the intelligent motion surface. Force applied to the driving devices and force producing devices located within the force areas may produce movement of an object in a desired direction.

The intelligent motion surface controllable force producing devices move the object multidirectionally and parallel to the intelligent motion surface, and the driving devices engage the force producing devices for independently operating the force producing device. Each driving device causes the force producing devices to operate in a separate direction. The intelligent motion surface is divided into multiple cells, each cell having force producing devices and driving devices for moving the object in different directions.

The system thus comprises a software component controlling and driving hardware. The software controller establishes selected force fields on the intelligent motion surface, and these force fields drive the object to a desired destination and orientation. The intelligent motion surface thus provides the capability to translate, rotate, orient, and feed the object as desired. The hardware implementation of the driving devices and force producing devices depend on the object and task desired, and a relatively infinite array of hardware implementations are possible. Four of the possible hardware implementations are outlined herein as particular hardware embodiments.

According to a first hardware embodiment of the invention, there is disclosed a unitary motion surface which is a pivotable planar surface element hinged at an edge of the element for pivotal motion away from the surface of the apparatus. The pivotable planar surface is constructed using a silicon VLSI process, and may be constructed of metal, silicon dioxide, or other VLSI material, and has an air cored coil wound within the surface. A magnet is located below the unitary motion surface. When power is applied from the motion controller, a magnetic field is created and the pivotable planar surface rises away from the surface of the apparatus and the magnet beneath it.

According to a second hardware embodiment of the invention, called a LAMBDA manipulator, there is provided a robot having a main beam with a base and tip on the main beam, a secondary beam with a base, so that the secondary beam adjoins the main beam at a pivot point along the main beam. Each beam is pivotally attached at its base to a base joint, and the beam joints are linearly driven by the driving devices. Motion of the beam joints drive the main beam and the secondary beam, thus moving the tip of the main beam in a curvilinear direction.

According to a third embodiment of the invention, the unitary motion surface comprises a selectably driven ball bearing. The driving devices are centrally mounted rotational devices located beneath the ball bearing, and the ball bearing is driven in a controlled motion and direction.

According to a fourth embodiment of the invention, there is provided a motion device capable of moving over a substantially level plane in a desired direction. The motion device includes multiple motion cells, each motion cell comprising independently controllable unitary motion surfaces capable of providing a force in at least one direction. The device has a motion controller for independently operating each controllable unitary motion surface to move the device. The motion device has at least one unitary surface driving mechanism for operating a moveable unitary motion surface in the cell in response to commands received from the motion controller, and a main controller for translating the desired movement over the surface into commands for each of the motion cells.

Other objects, features, and advantages of the present invention will become more apparent from a consideration of the following detailed description and from the accompanying drawings.

DESCRIPTION OF THE PREFERRED EMBODIMENT

Figure 1A:
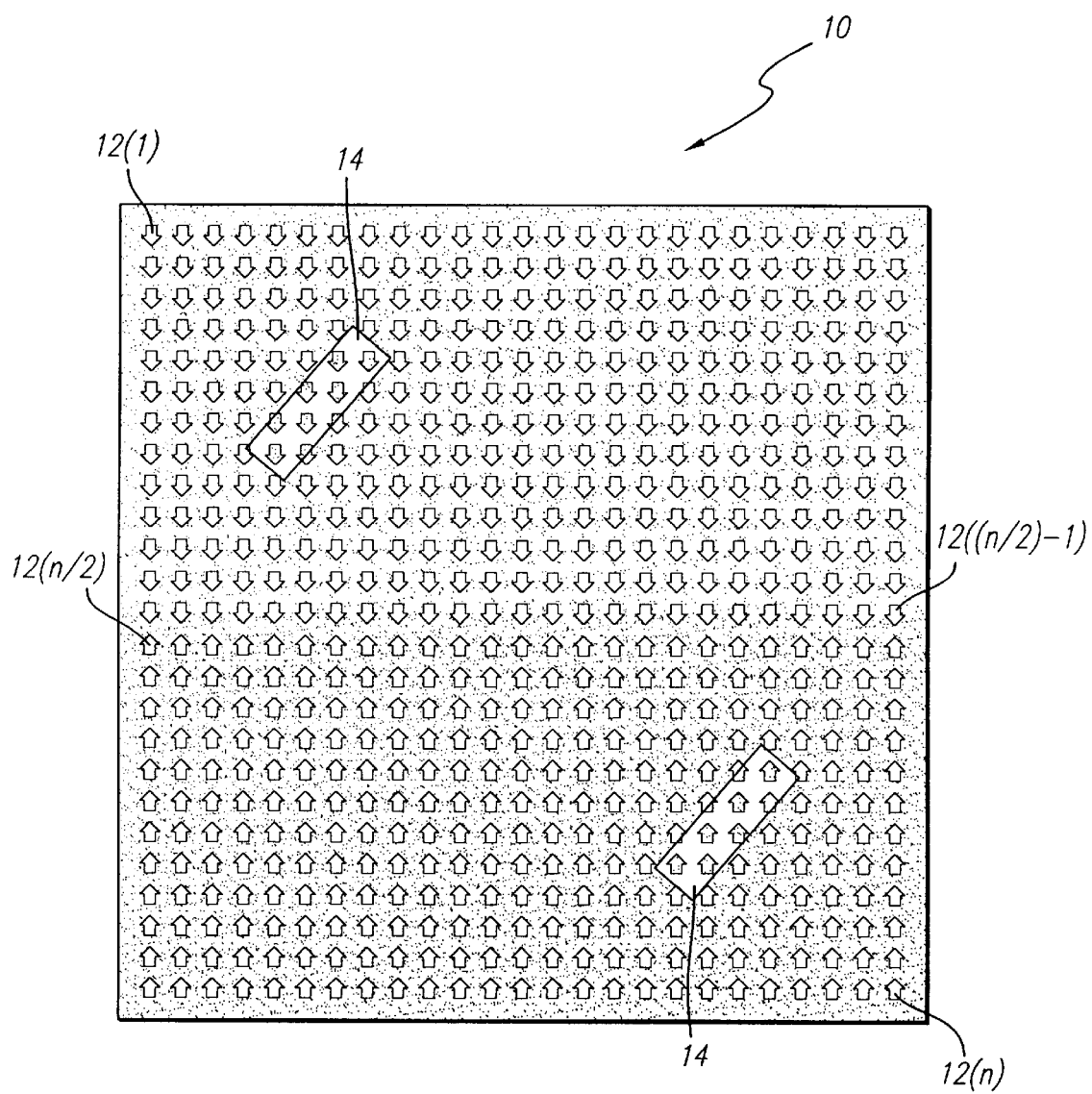
FIGS. 1a through 1n illustrate the intelligent motion surface of the present invention and movement of objects and tools located thereon.
Figure 1B:
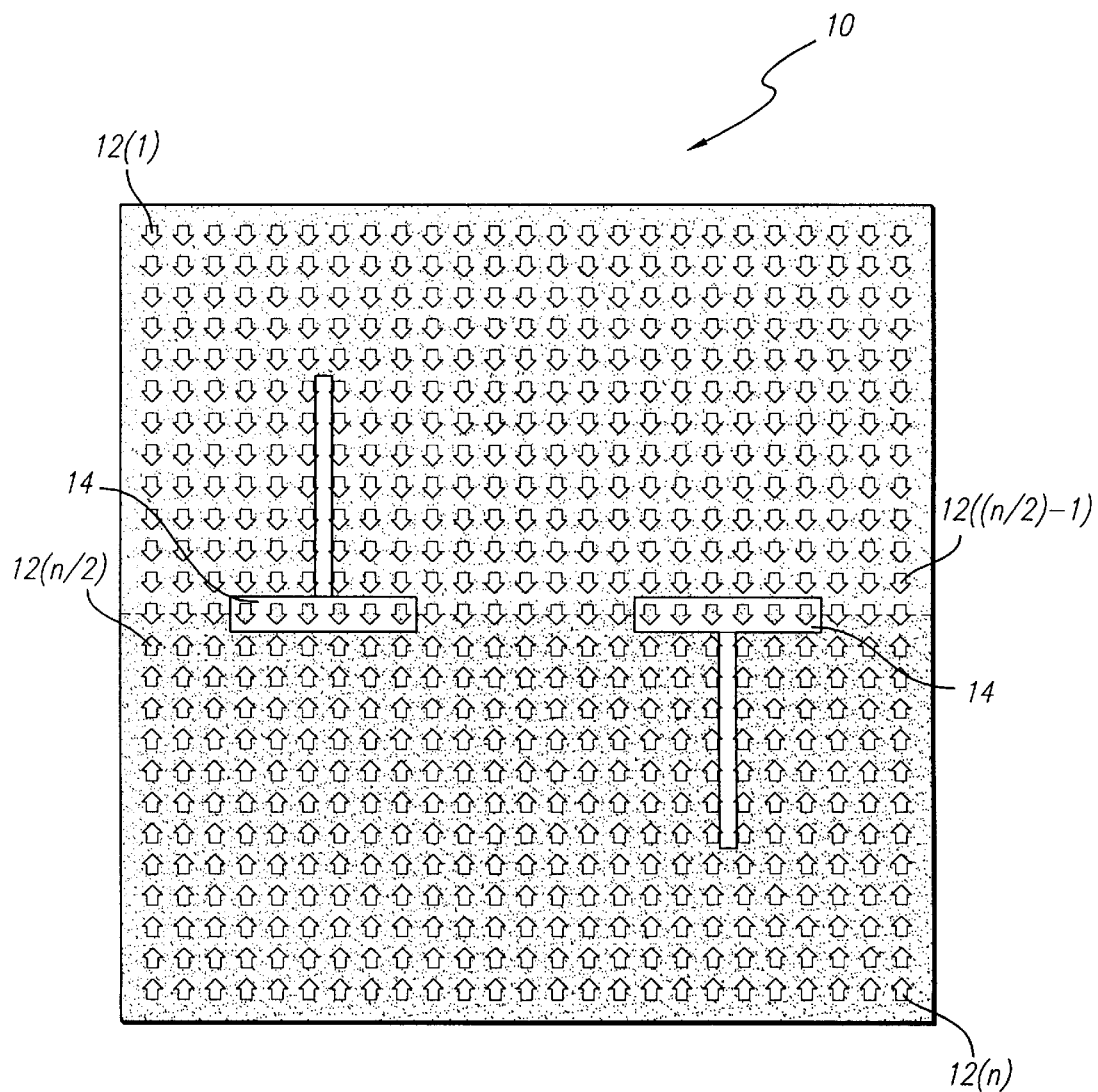

FIG. 1a shows a surface 10 having multiple cells, 12(1) through 12(n). The cells 12(1) through 12((n/2)-1) are programmed to operate to create motion in a downward (southward) direction. Cells 12(n/2) through 12(n) are programmed to operate to create motion in an upward (northward) direction. As shown in FIGS. 1b, an object 14 of any shape placed on the surface 10 is moved by the cells 12(1) through 12(n) to the center of the surface. If the object 14 is placed on the east end of surface 10, the object will move to the center of the east end of the surface. Each of the areas, 12(1) through 12((n/2)-1) and 12(n/2) through 12(n), define a force area or force field, and force fields are assigned to different areas of the surface 10 depending upon the desired task. Force conditions move the object along a particular path toward a desired position and orientation. The centroid of the contact footprint of object 14 is moved to the line of demarcation between force areas, such that in FIG. 1b, the object is moved to the line between the force area defined by cells 12(1) through 12((n/2)-1) and the force area defined by cells 12(n/2) through 12(n). The object 14 may rotate or vary until the forces on object 14 are balanced. At a minimum, as currently contemplated, four cells 12 are necessary for operation in order to adjust an object 14 on the surface 10, but optimal operation occurs when multiple cells 12 exist on surface 10.

Figure 1C:
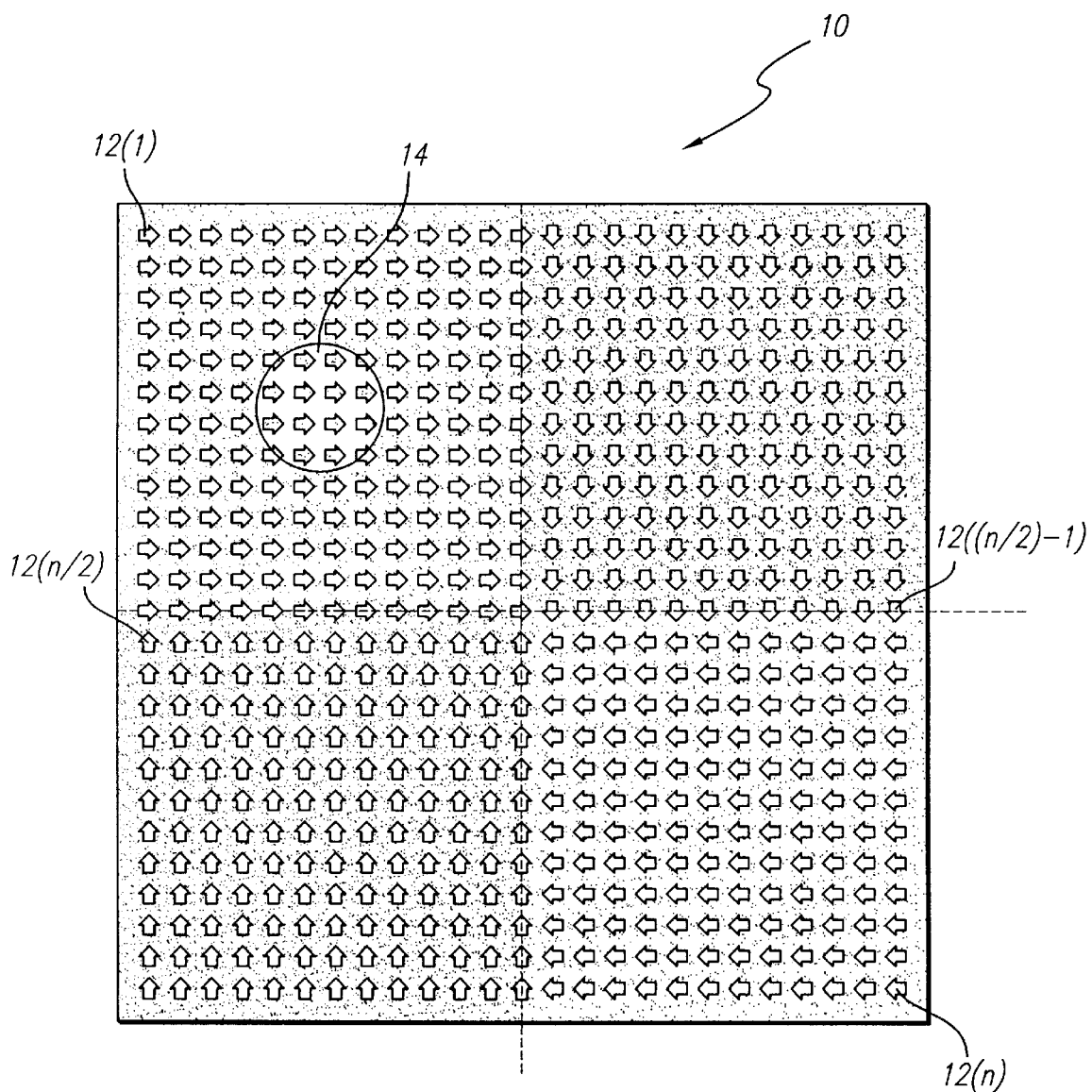
Figure 1D:
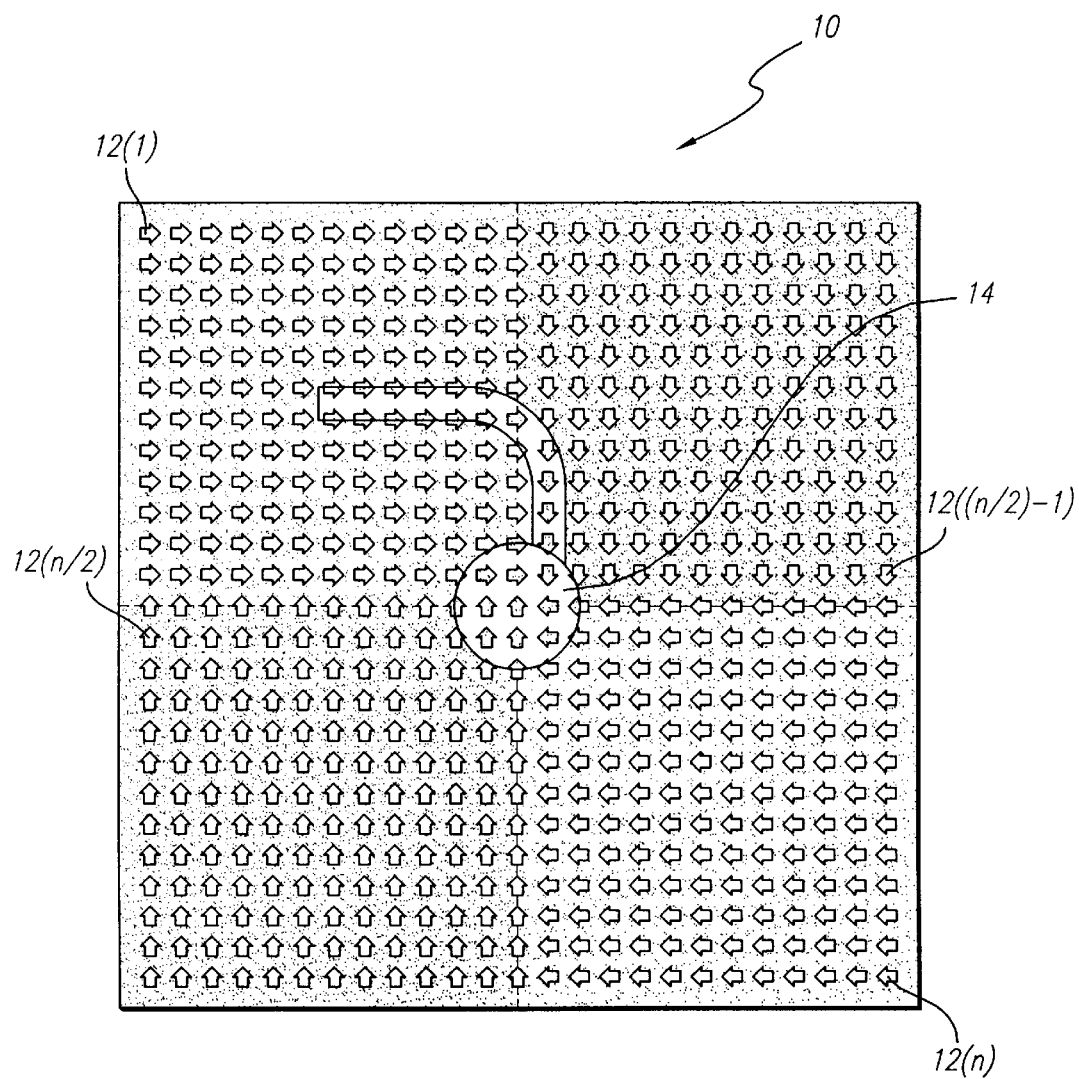

FIG. 1c illustrates the same surface 10 with cells 12(1) through 12(n) controlled to create motion in a circular direction. Such orientation of cells 12(1) through 12(n) creates a motion over the surface such that, as shown in FIG. 1d, when an object 14 is placed on the surface, the object rotates to the center of the surface. Continued operation of the surface 10 in this circular pattern causes the object 14 to continue to rotate around the center of the surface 10.

Figure 1E:
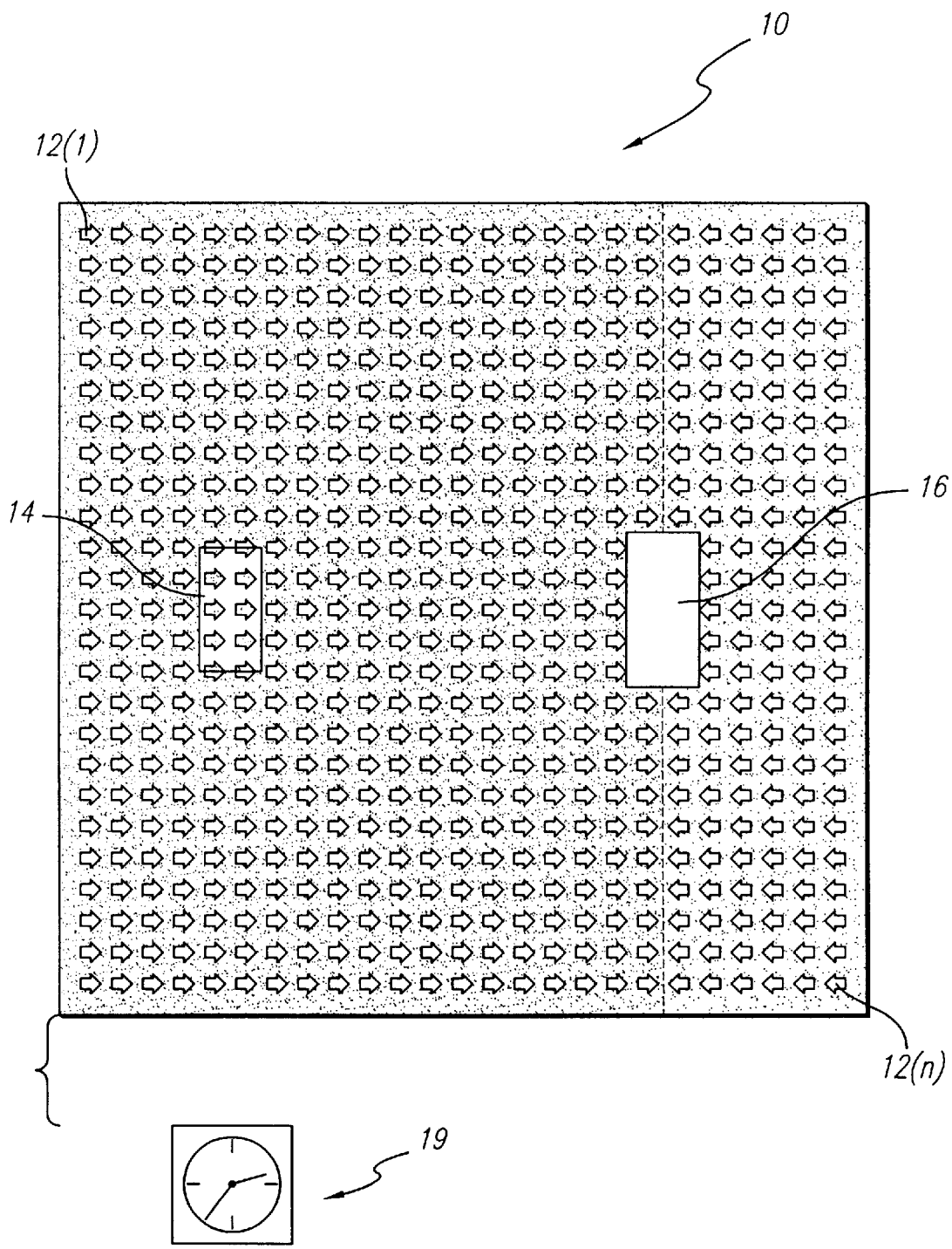
Figure 1F:
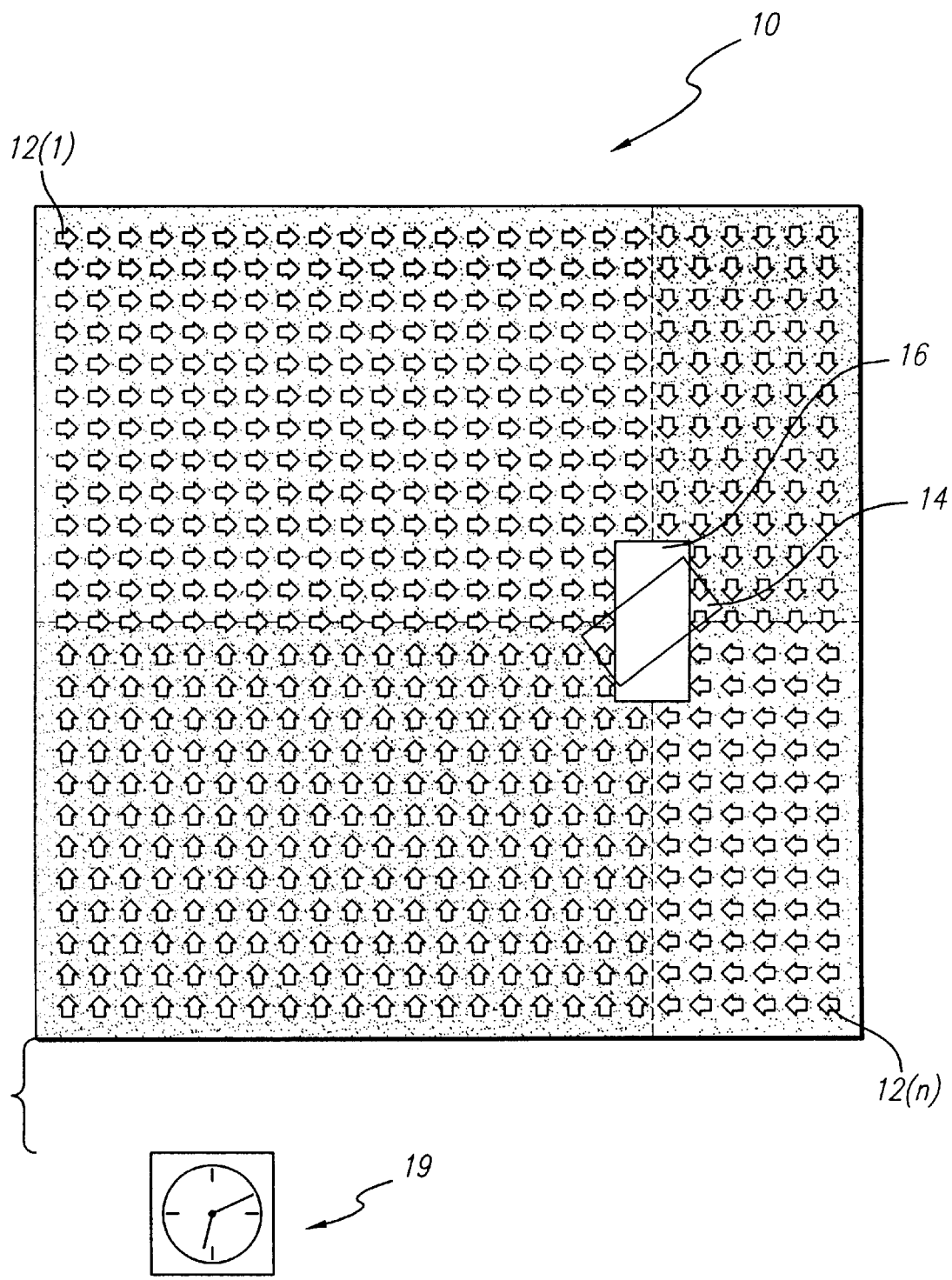
Figure 1G:
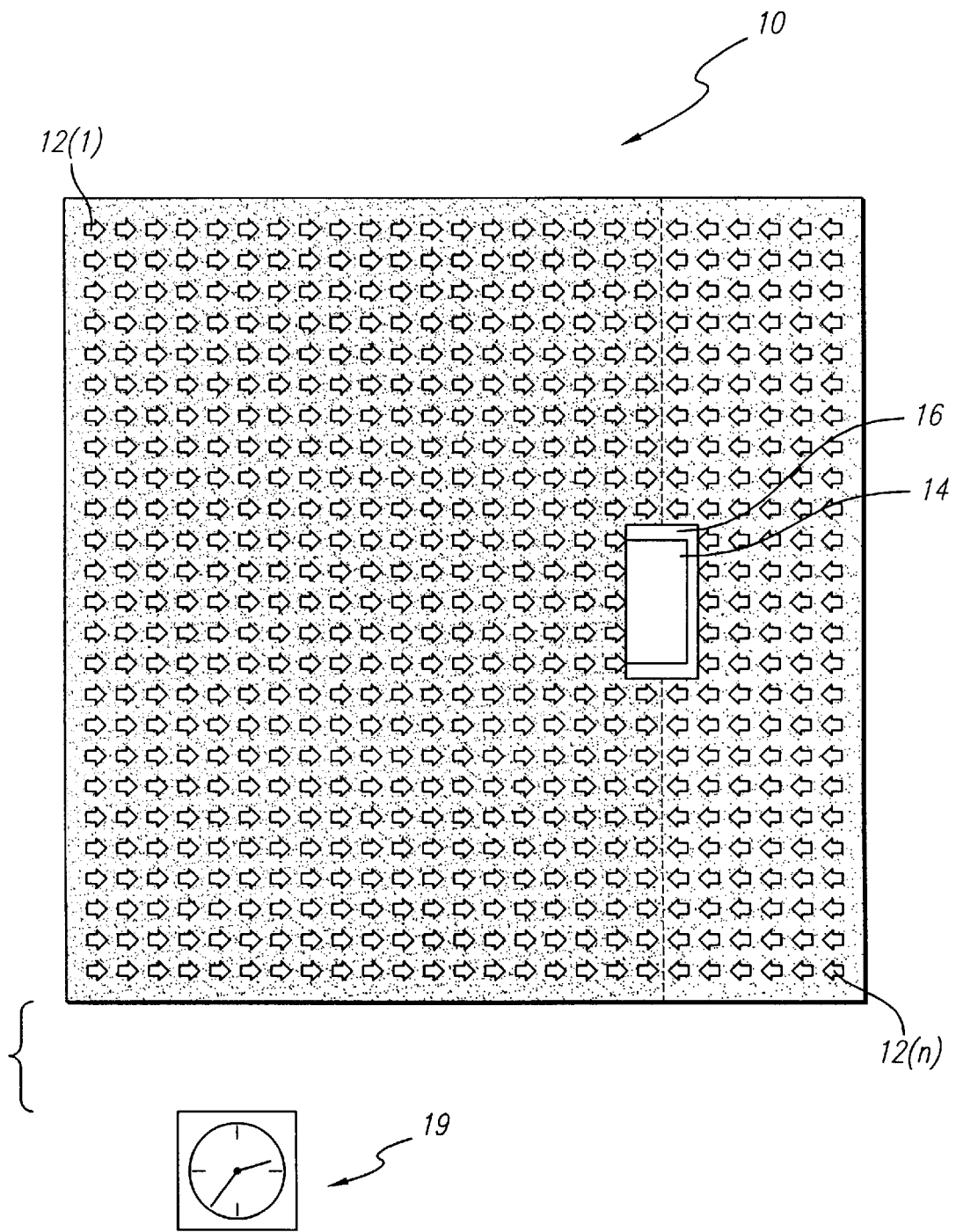
Figure 1H:
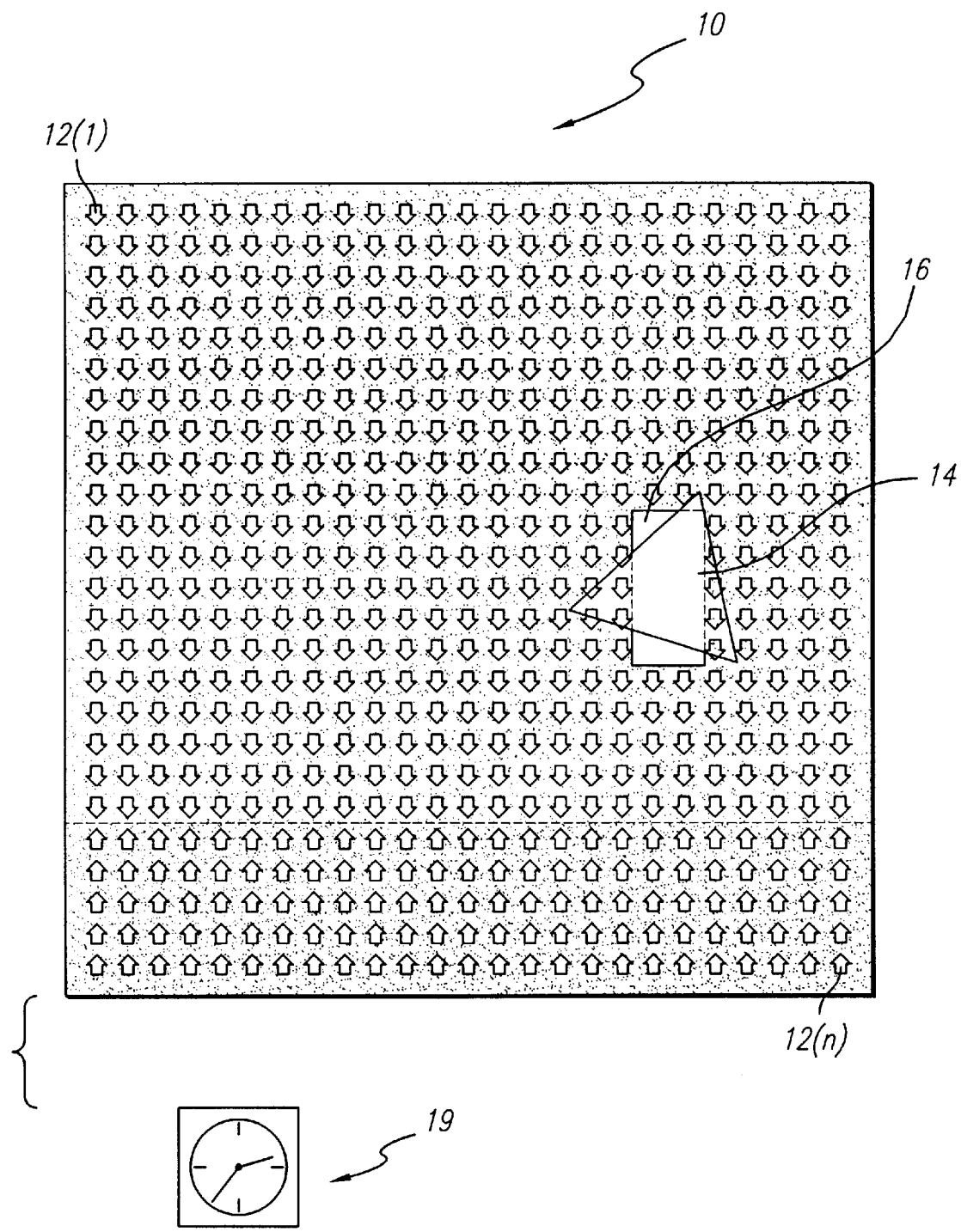
Figure 1I:
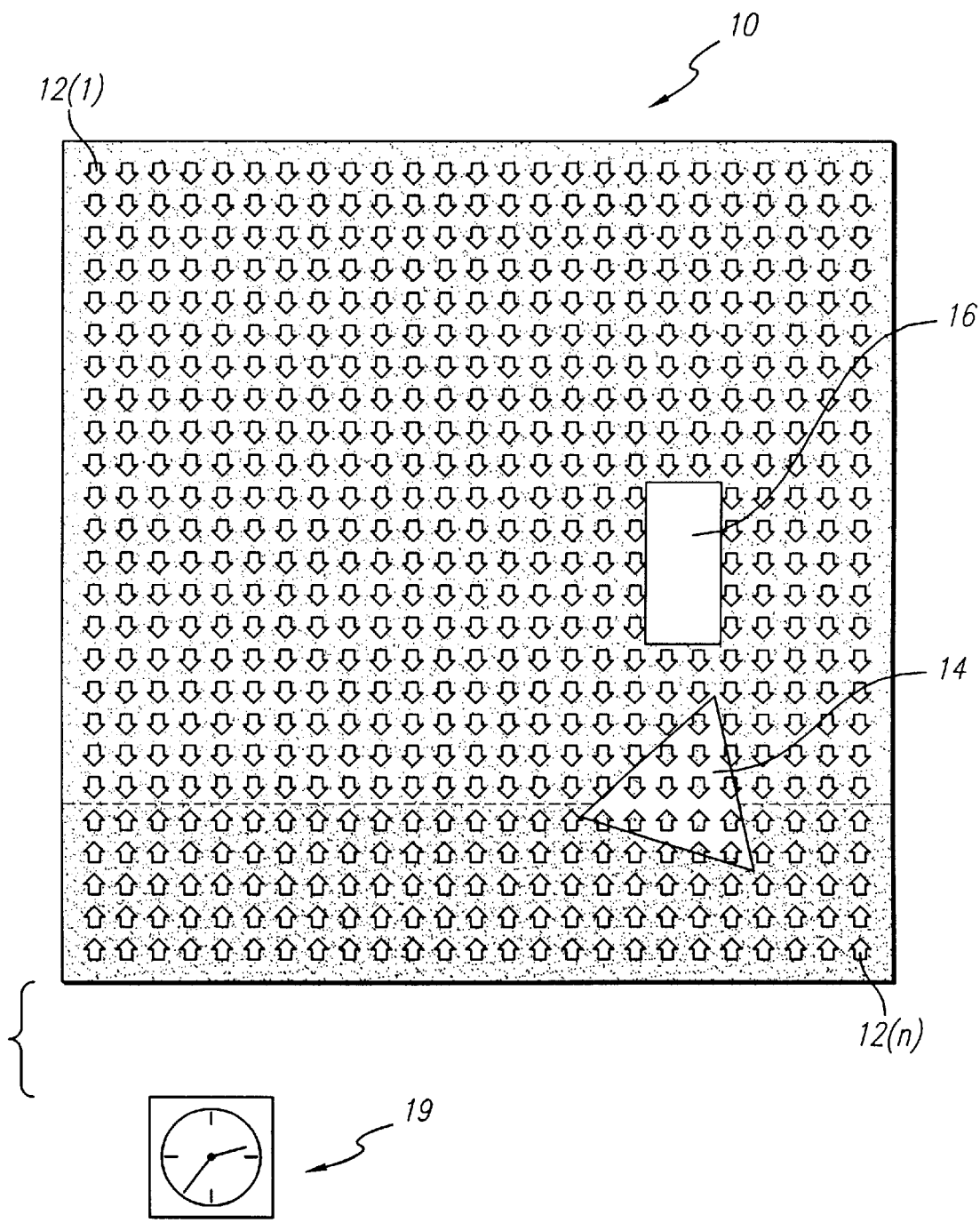
Figure 1J:
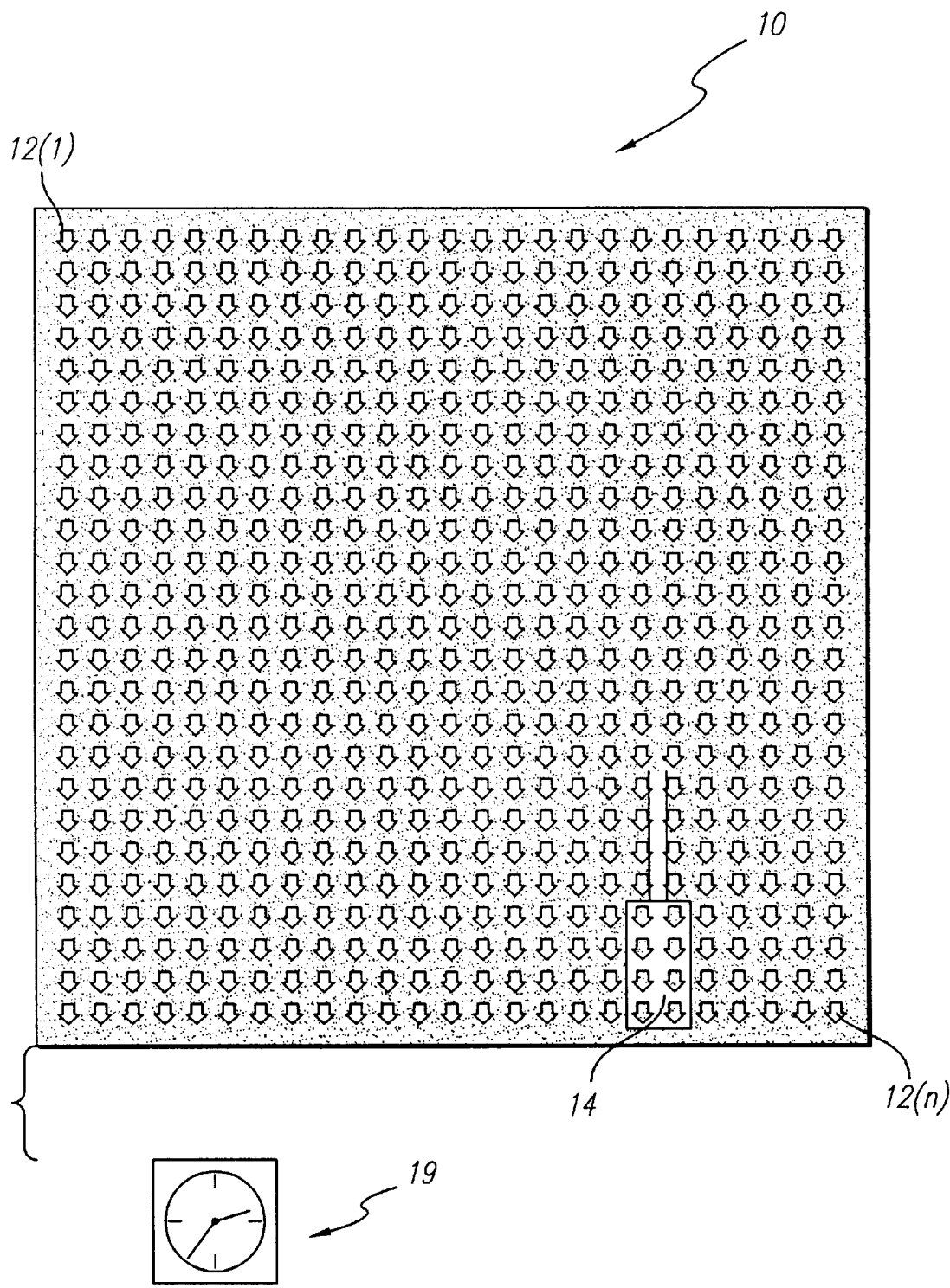

Other orientations of the surface can provide similar useful functions. For example, as shown in FIGS. 1e through 1j, orienting particular cells to leave a block of unused cells 16, or "hole", allows proper orientation of a part or sorting to determine if the part has the proper shape. If the object 14 is rectangular in shape, and the block of unused cells 16 is slightly larger than the object 14, the remaining cells 12(1) through 12(n) which are not a portion of the block of unused cells 16 may be controlled to provide motion such that the object is propelled into the hole and stays there. If the object 14 is not the proper size, it may move about the hole or past it altogether. FIG. 1e illustrates a scenario whereby the remaining cells are controlled to move the object either left or right. Regardless of the position the object 14 is initially placed on the surface 10 in the scenario shown in FIG. 1f, the object 14 moves to the dividing line between the two non-"hole" force fields set up by the cells 12(1) through 12(n) and stays on this dividing line until the force fields so established are altered. After a period of time, the control may be altered to provide rotational capability, centered around the "hole", as shown in FIG. 1f. Such rotation provides proper orientation, since when the object 14 is oriented properly on the surface 10, the object 14 will cease to move due to the zero motion of the block of unused cells 16. Successful orientation is illustrated in FIG. 1g. If the object 14 is not the correct part shape, after a certain time the surface cells exclusive of the block of unused cells may be directed in a particular direction, which will direct the incorrect object 16 off the surface, indicating the object is not of proper shape (FIGS. 1h and 1i). After time has passed so that an improperly shaped object would have moved off the surface, all cells may be enabled to move a correctly shaped object 14 to a subsequent location in proper orientation (FIG. 1j). Moving the object 14 off the surface 10 may indicate that it is a different part than that desired, and thus the part may be re-fed to the surface at a later time, if desired.

FIGS. 1e through 1j present a necessary element of the open loop control provided by the surface to attain the proper orientation and position of the part, which is the temporal factor involved. Depending on the placement of the object 14 on the surface 10, the object 14 may attain a position at the junction of the force fields shown in FIG. 1e in a particular amount of time. Thus, if a large, difficult to move object 14 is placed on the far left edge of surface 10, then the object will not enter the "hole" 16 for a longer amount of time than if a small, easily moved object 14 were placed close to hole 16. In this situation, before the surface is changed to the rotational configuration of FIG. 1f, adequate time must have passed for the large, difficult to move object 14 to attain the desired position. If rotation is commenced too early, the object 14 will not attain its desired position and may be incorrectly evaluated to be the wrong object. Thus, depending on the application, if no sensory capability is provided for proper feedback, trial and error may be necessary to determine the amount of time necessary for all objects to have the capability to attain the desired destination from all points on the surface.

Figure 1K:
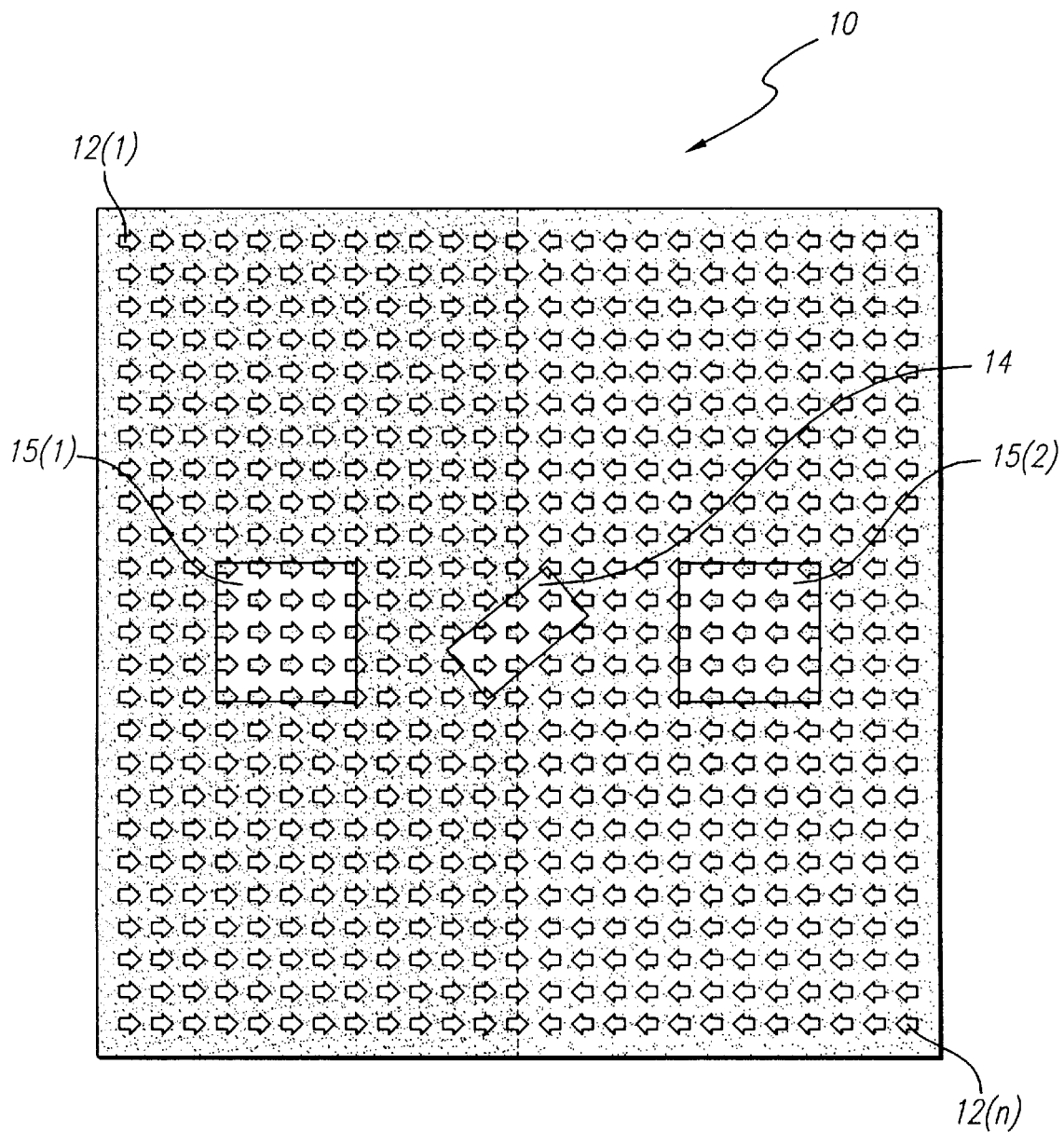
Figure 11:
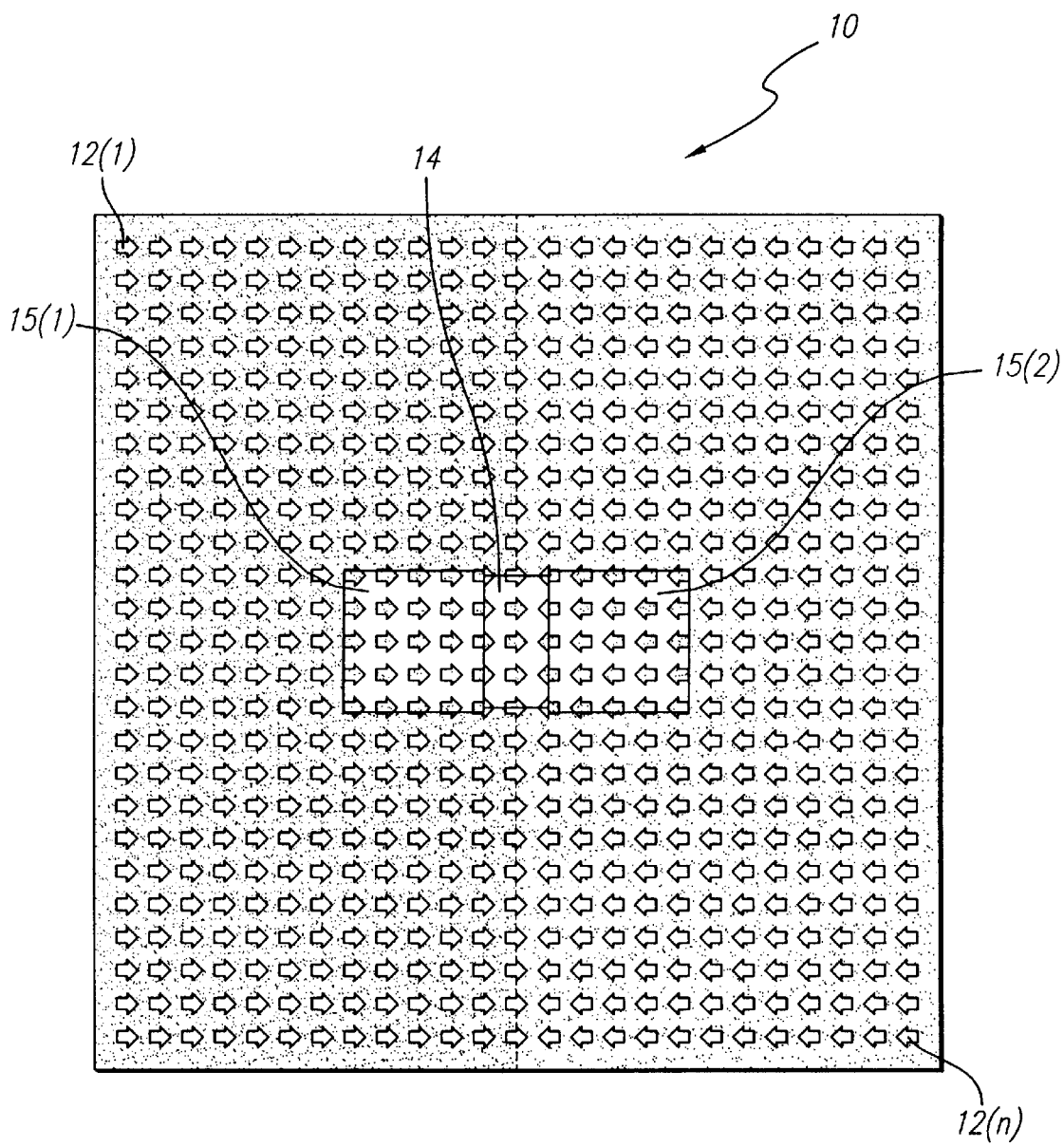

An further beneficial aspect of the present invention is the concept of tools, or other objects used in conjunction with the target object to complete the desired task. For example, as shown in FIGS. 1k and 1l, there are three items located on the surface 10, including two large tools 15(1) and 15(2) and one small target object 14. Tools are useful when the surface 10 cannot successfully manipulate the object as desired, and assistance is necessary. For example, in FIGS. 1k and 1l, assume object 14 cannot be manipulated by the surface as desired, either because it is too heavy to lift adequately, or it is necessary to move object 14 more rapidly than normal operation would dictate. In this case, operation of the surface 10 in the desired direction, including establishing the desired force fields on the surface 10, provides motion of the large tools 15(1) and 15(2) to clamp object 14. The size and mass of these tools 15(1) and 15(2) provide adequate force to trap object 14 in a desired orientation or location, and can accomplish this task in a shorter amount of time than otherwise is possible.

Figure 1M:
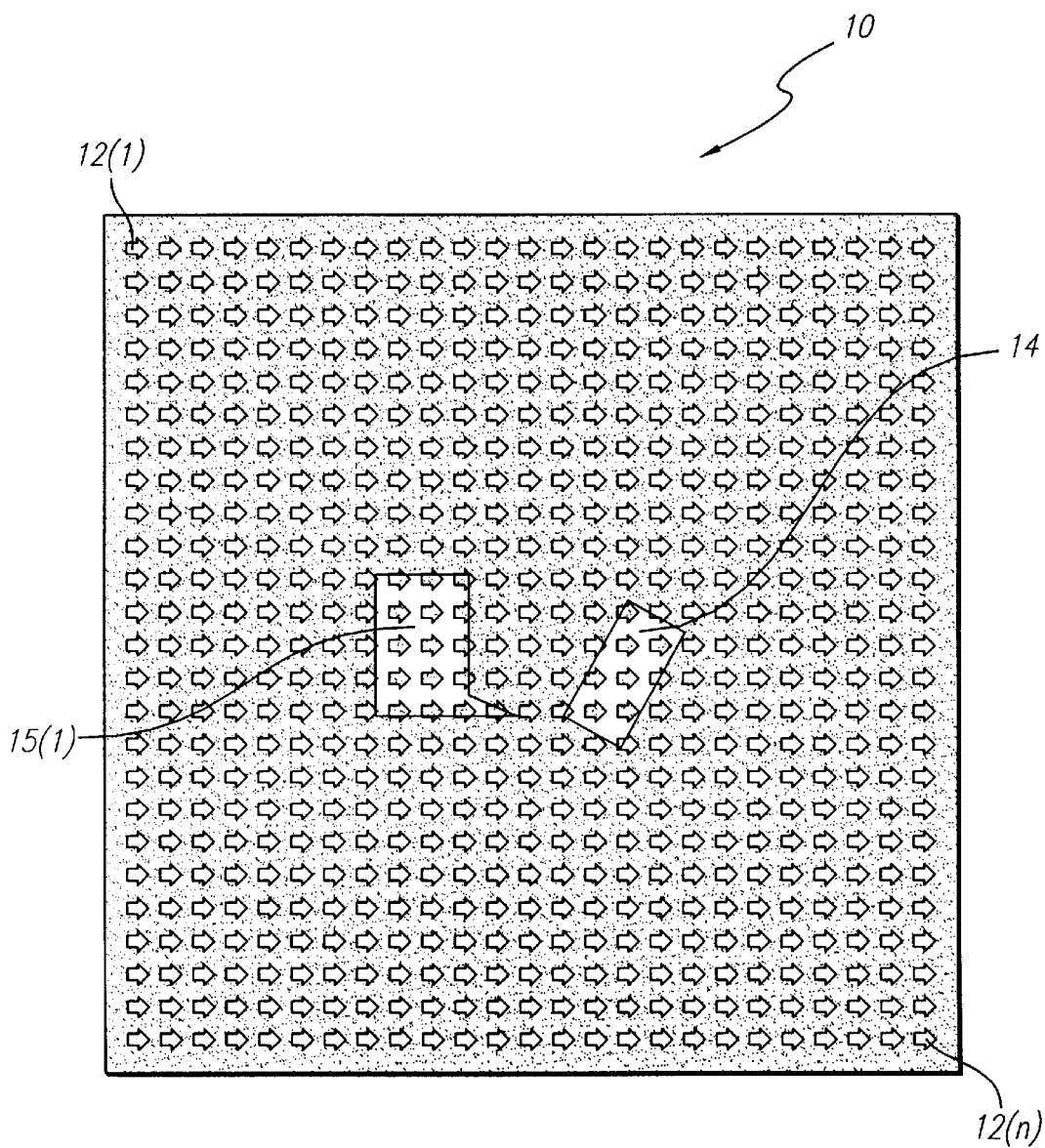
Figure 1N:
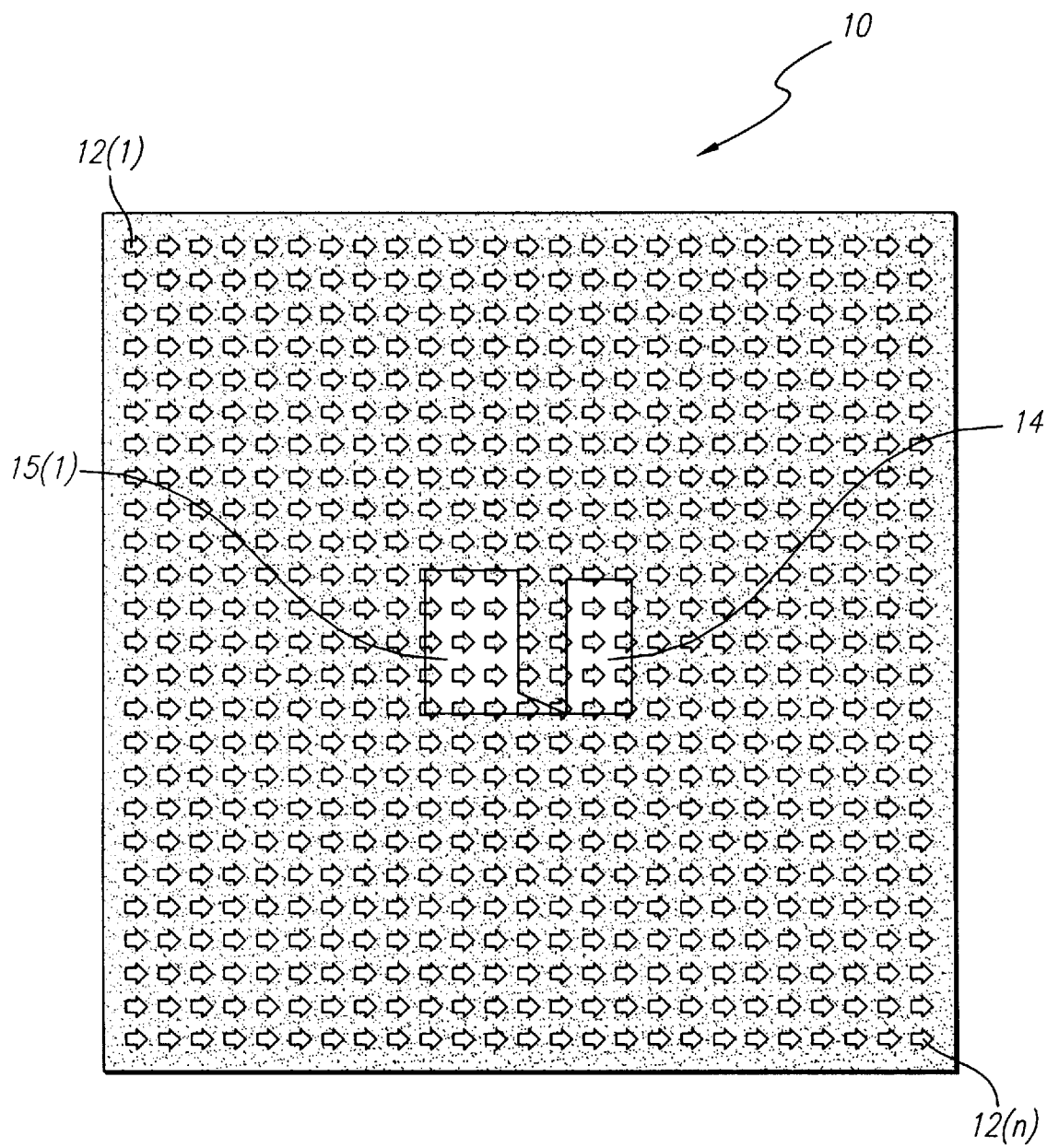

Further use of a tool is shown in FIGS. 1m and 1n. The desired motion of the object 14 is to move the downward end of the object, or to force the object to attain a vertical orientation. Again, use of a tool 15(1) is necessary because the surface cannot perform the desired task adequately. The tool 15(1) chosen has adequate mass and its shape provides mechanical leverage when applied to the object 14. Force applied by the surface 10 to tool 15(1) and the mass of this tool is adequate to move the object 14, much in the same manner a tugboat is able to maneuver a large ship.

Implicit in the discussion of the object or objects 14 shown in FIGS. 1a–1n is the requirement that the object or objects be flat, or have a flat cross-sectional area exposed to the intelligent motion surface 10. In practice, as long as the object 14 is stable when placed on the surface 10, the object may be moved over the surface by the cross-sectional area exposed to the surface 10. For example, a four-legged chair standing upright on the surface 10 may be moved along the surface even though only four relatively small points are in contact with the surface 10. Objects 14 having holes, or cutouts, or multiply connected odd-shaped objects which are stable can be manipulated, oriented and fed using the surface 10. Thus, substantially flat, planar objects may be moved over the surface 10. It is thus self-evident that an object having small spikes which conflicted with the operation of the cells 12(1) through 12(n) could not be moved, or other uncommon shapes which would prevent proper operation (i.e. an unwound ball of string or non-solid objects such as pudding, etc.).

The size of object 14 dictates the applicability of the system and its usefulness in the task desired. For example, in FIG. 1a, if the object 14 was larger than the cells 12(1) through 12(n) combined, fine positioning of the object 14 may be obtained, but not extensive movement over the surface 10.

Control of the individual cells 12(1) through 12(n) is thus of paramount consideration. The cell members may be in any form, as long as they provide directional movement in at least four orthogonal directions, such as north, south, east, or west, and provide the necessary force fields to move the object 14 over the surface 10. More than four directions of control would, of course, be beneficial if available for the application considered. Without being limited, several possible embodiments are disclosed below for the system, but the intelligent motion surface may include any apparatus for moving an object, including mechanical components, such as arms or ball bearings, or fluid components, such as air or water currents which may be directionally controlled in at least four orthogonal directions, or electrical or electromechanical components for manipulation of metallic or otherwise electrically or robotically moveable objects. Size may dictate possible methods for manipulating the direction of the object, but the concept of moving large parts, such as automobile parts, or small parts such as microcircuits dictates the components necessary to effectuate control of the surface. Without limitation, however, the instantaneous controllability of a surface is disclosed herein, specifically multidirectional control of an object over the surface. Based on the above disclosure, the following four embodiments disclose the means for creating and coordinating motion on the cells 12(1) through 12(n) disclosed above.

Figure 2A:
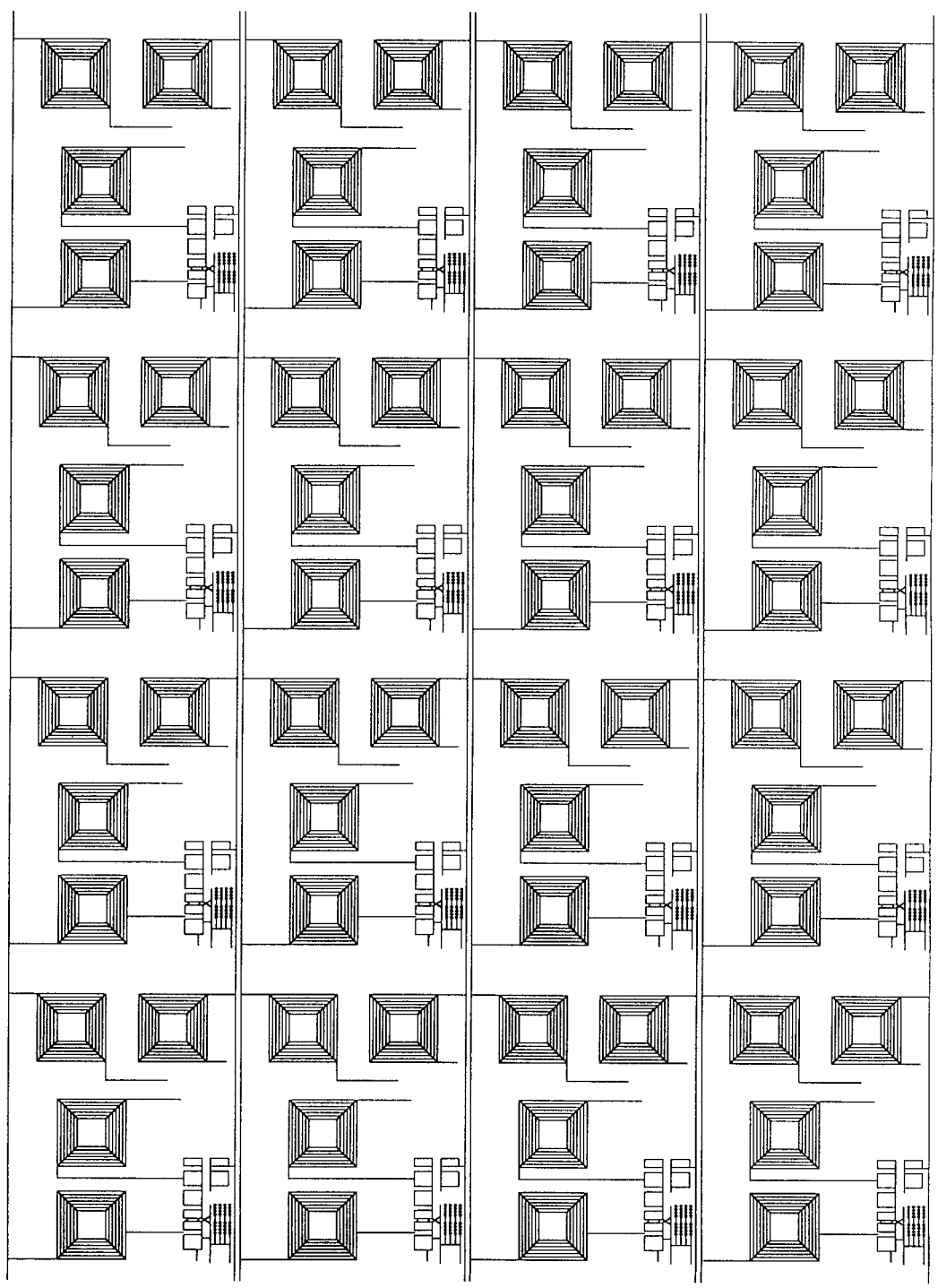
FIGS. 2a and 2b show a first preferred embodiment of the invention, including several cells each having a control mechanism and individual unitary motion surfaces.
Figure 2B:
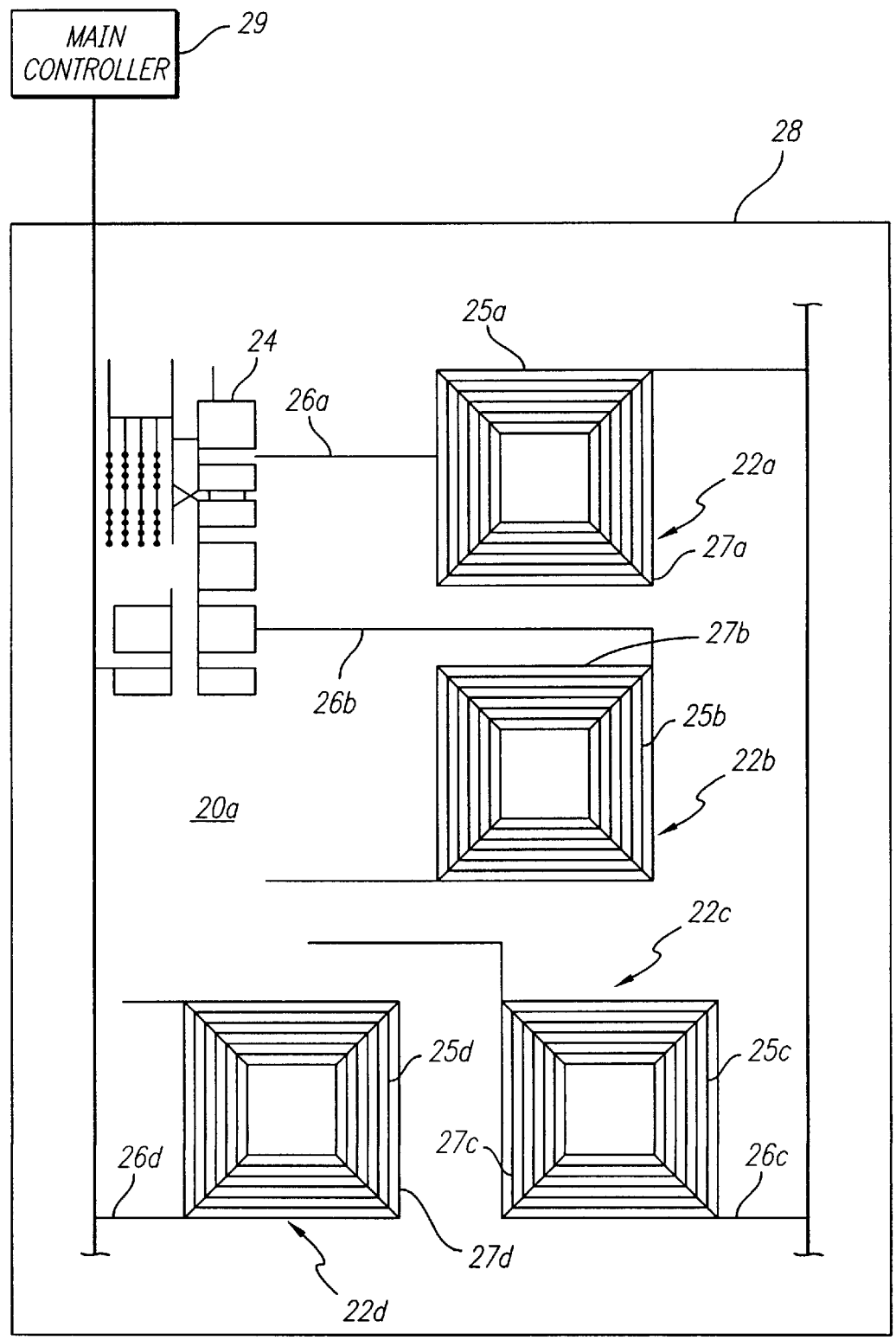

FIG. 2a illustrates a first preferred embodiment of the invention, utilized primarily in microdevice manipulation applications. FIG. 2a shows a series of cells 20a through 20p which comprise a section of the entire surface 10. Each cell 20a through 20p includes unitary motion surfaces, drive circuitry, and control circuits, and each cell is less than 0.0125 inch in width. Currently, the contemplated size of each cell is 50 to 250 microns on each side. Other cell sizes may be utilized, and depending on the size of the microdevices used, smaller or larger cell sizes would suffice and provide the benefits of the device disclosed herein. FIG. 2b presents an enlarged view of first cell 20a. For convenience, the directions of the cell will be referred to as north, south, east, and west. The north movement surface 22a receives input from cell controller 24 via north control wire 26a, which causes the north surface 22a to pivot about the south edge 27a of the surface, or flap upward. The south movement surface 22b is controlled by south control wire 26b, and causes the south surface 22b to pivot about the north edge 27b of the surface. The result of the properly coordinated north and south surface movement is to provide controlled vertical movement of an object 14 over first cell 20a.

Similarly, east movement surface 22c and west movement surface 22d are controlled by east control wire 26c and west control wire 26d, respectively. Both movement surfaces are controlled by cell controller 24, as are the north and south movement surfaces. The east movement surface 22c pivots about its west edge 27c and the west movement surface 22d pivots about its east edge 27d, providing east/west control of the object over first cell 20a.

Each surface in this embodiment, such as movement surface 22a, consists of an air cored coil 25a–d such that when power is applied from cell controller 24, a magnetic field is created and the movement surface rises away from the surface due to the electromotive force applied. As shown in FIG. 2b, a magnet 28 is located beneath the surface of each cell to provide the magnetic field. The movement surfaces may be constructed from different materials depending on the amount of torque required from the movement surface. The movement surface could be coated with a suitable magnetic material if desired to increase the force available, provided such coating is compatible with the process used in the circuitry. As with all embodiments of the device, the actuation of the system is provided from a main controller 29, which determines the motion of each individual cell based on the path desired for the necessary operation. As outlined in FIGS. 1a through 1l, different paths depending on rotation, translation, or selected movement of the object 14 require movement of the individual cells in separate and distinct directions. The main controller 29 provides this individual cell control. In FIG. 2b, the main controller 29 thus transmits a command to cell controller 24, which directs actuation of each individual unitary motion surface in the cell.

Main controller 29 is any type of digital computer or other device capable of defining an area over which force is applied in a particular direction on the intelligent motion surface. The main controller 29 must have the ability to define at least one such force area, and depending upon the desired task, provide variable control over the force transmitted from a single cell. The force field shapes are thus derived from the characteristics of the part to be moved and the desired task. Such definition of the force areas is implemented by software which can be written by one reasonably skilled in the art of software programming. Further, if a sensing device is provided, automatic feedback may be utilized to provide automatic control over the position of the object 14 on the surface 10.

Many kinds of motion control are possible, including friction based motion control and kinematically based motion control. Other types of motion control are possible, such as electromagnetic control, or fluid control, such as water or air.

Coordination of the individual movement surfaces in adjacent cells requires advanced control to properly and efficiently move an object in a desired direction over a surface. For example, if all north surfaces in each cell 20a–20p were to actuate and retract at the same phase and magnitude, such movement would only raise and lower the object and produce no tangential motion of the object 14. Thus coordinating the surfaces to move the object is necessary, and such coordination will be addressed below.

The second preferred hardware embodiment operates using a LAMBDA manipulator. Four individual LAMBDA elements will perform the same function as the four movement surfaces 22a–d outlined in the first hardware embodiment. The LAMBDA surface is illustrated in FIG. 3a.

Figure 3A:
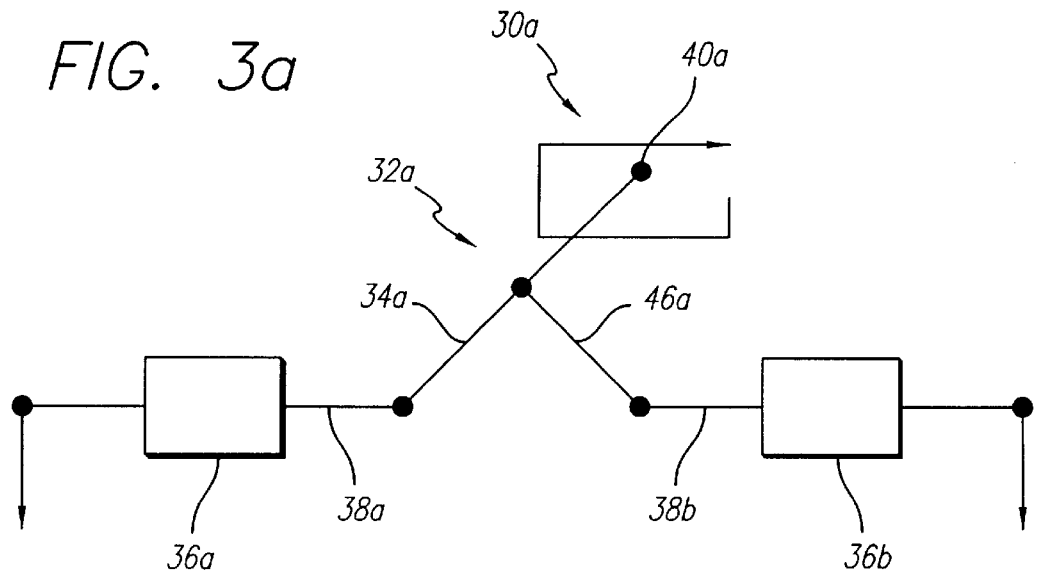
FIGS. 3a through 3n illustrate the concept of the LAMBDA manipulator and coordinated movement of the individual cells.

FIG. 3a shows a LAMBDA manipulator 30a with a pin joint 32a, having a main beam 34a inclined at an angle to the right of the vertical and a secondary beam 46a affixed to the main beam 34a at joint 32a. Two base motors 36a and 36b drive base joints 38a and 38b. Under control of the base motors 36a and 36b, the tip 40a of the manipulator 30a is designed to operate in relatively high left to right motion followed by a relatively lower right to left motion and thus to make a loop motion in space that will be defined as an "R-motion."

LAMBDA manipulators may be manufactured to operate on various scales, depending upon the size of the object 14 which the operator desires to manipulate. The application contemplated herein is for microassembly, but larger objects may be moved using larger LAMBDA manipulators, and smaller objects may utilize smaller manipulators.

The operation of an array of micro-LAMBDA manipulators on moving a part placed on the surface of the array can be illustrated using a linear array of manipulators operating in the same direction. The control of individual micro-LAMBDA manipulators may be synchronous or asynchronous, and control of motion may be used in accordance with various hardware embodiments of the invention.

Figure 3B:
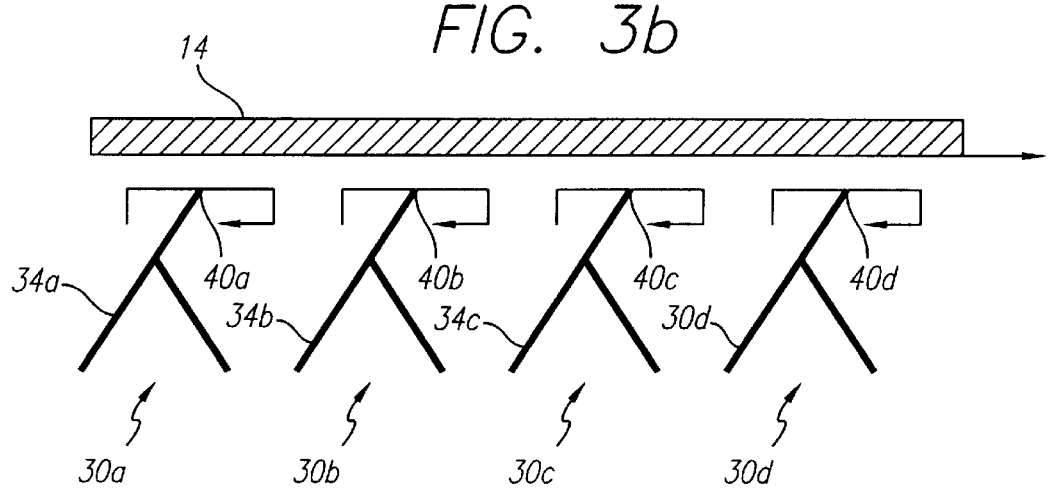

A first application, friction based motion, involves synchronous motion of all of the LAMBDA manipulators at the same time. An object 14 placed on the one dimensional array of manipulators 30a through 30d shown in FIG. 3b, each of which is executing an R-motion, will move, under suitable conditions, to the right. Rightward motion occurs since if high speed motion relative to the effective time constant of the mass of the object produces an inclined angle of the main beams 34a through 34d which causes the tips 40a through 40d to tend to slip on the leftward motion and "dig into" the object 14 on the rightward motion and push the carried object 14 to the right.

Alternatively, there is a differential friction between the two directions of motion of the base joints 38a and 38b relative to the object 14 and this differential friction impresses differential forces on the object in the two directions. Generally, for a properly sized object, the array will support the object without being crushed or overpowered. An array of LAMBDA manipulators using a unit cell in the form of a mirror image of the R-manipulator would move parts-to the left, i.e. execute an L-motion, thereby providing two directional control. Similarly, two directional control may be provided by an additional pair of orthogonally mounted LAMBDA manipulators.

Figure 3C:
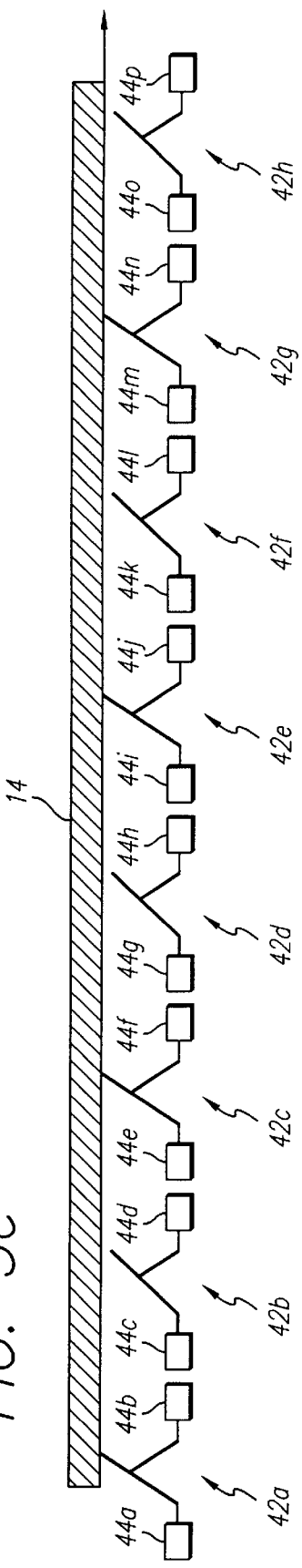
Figure 3M:
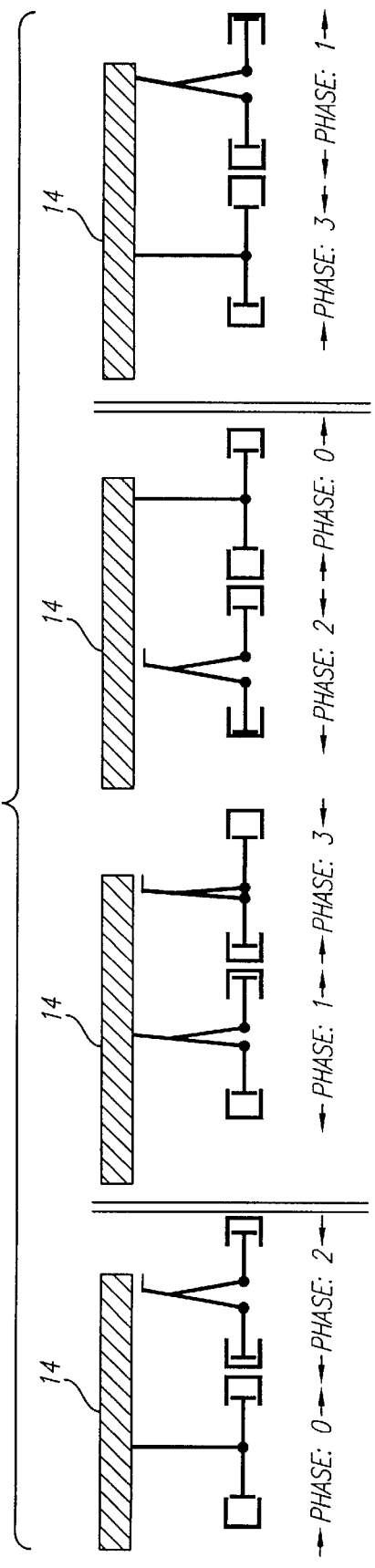
Figure 3D:
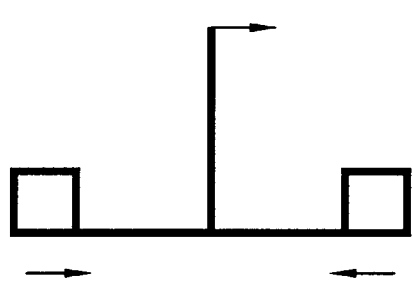
Figure 3E:
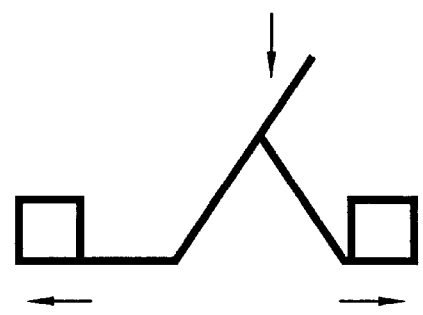
Figure 3H:
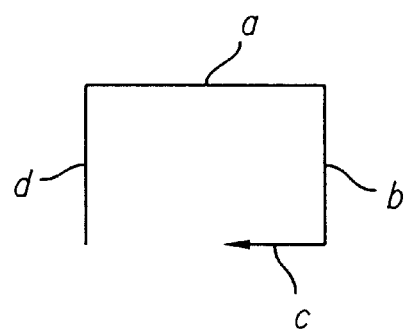
Figure 3G:
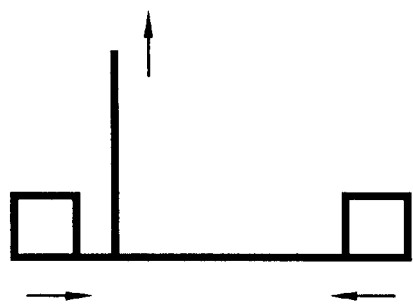
Figure 3F:
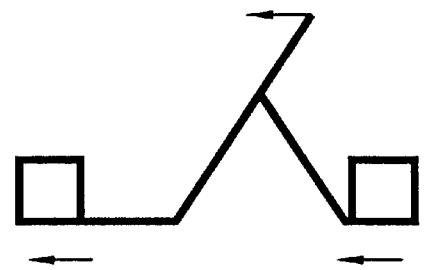
Figure 3I:
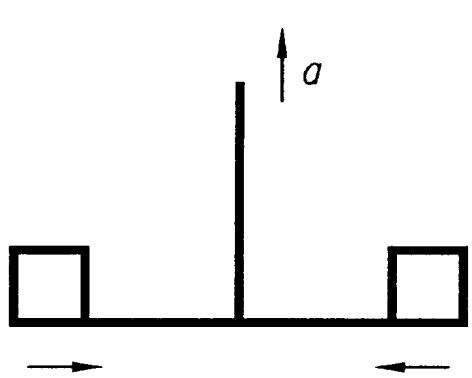
Figure 3J:
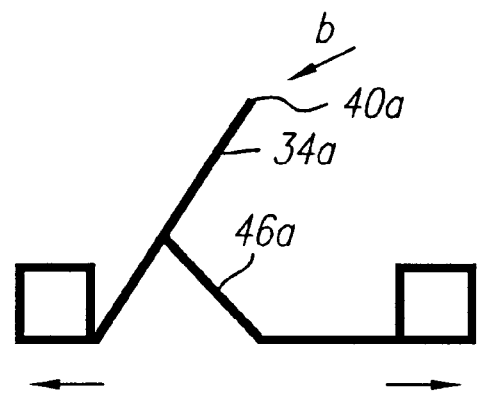
Figure 3L:
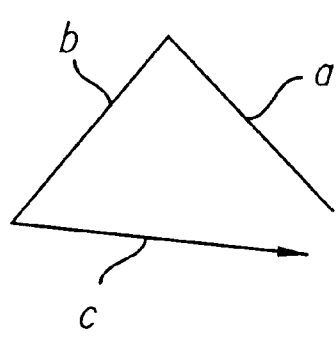
Figure 3K:
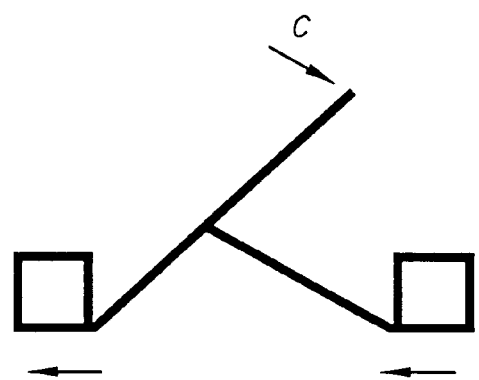
Figure 3N:
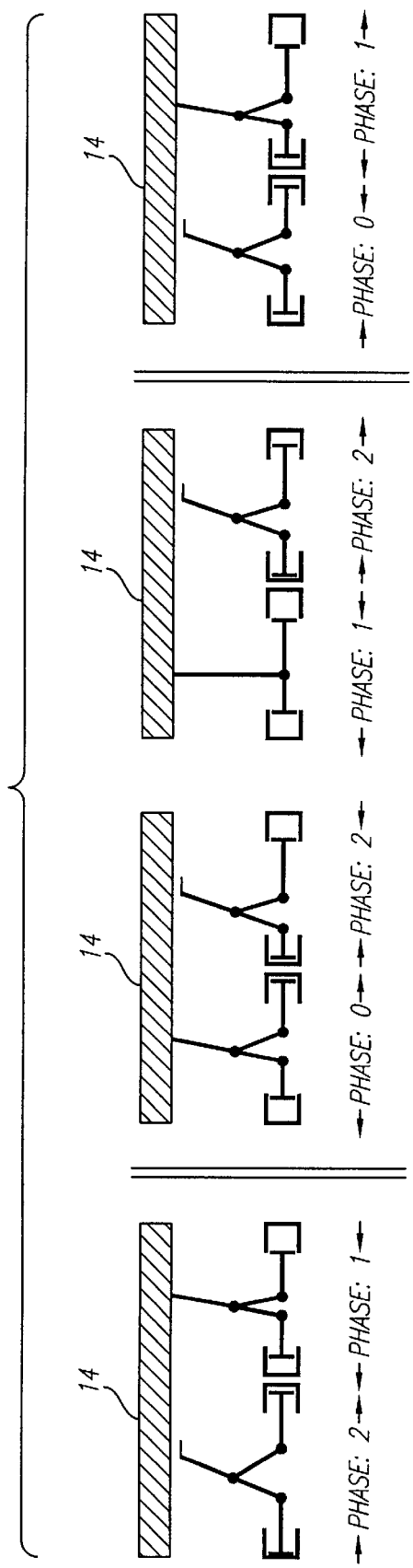

A second application uses kinematic gaits, or coordinated movement between alternate LAMBDA manipulators. The difference in friction in the two motion directions, right and left, may be insufficient to drive the object 14 forward. In such a situation, a second mode of control divides the drive array for a single direction into two interleaved sets, the odd and the even LAMBDA manipulators, in order to achieve more positive control of the forces applied to the object 14 being carried. As shown in FIG. 3c, odd LAMBDA manipulators 42a, 42c, 42e, and 42g move uniformly, while even LAMBDA manipulators 42b, 42d, 42f, and 42h move out of phase, with the odd LAMBDA manipulators and synchronized with each other.

The idea of the asynchronous operation is that the odd and even LAMBDA manipulators hold and drive the part alternately. This mode of motion is generally called a "gait." Gaits need not be strictly interleaved but may have random phase or a pattern suited to the object 14 being carried. Some manipulators can be used in supporting the parts while some of the manipulators retract and others drive forward. Each motor 44a through 44p must be individually controllable in order to achieve maximum manipulation flexibility.

First, the even LAMBDA manipulators 42b, 42d, 42f, and 42h would support the object 14 while odd LAMBDA manipulators move to the left-most position to execute the up and to the right motion, thus moving the supported object 14 one unit to the right. At this point, the odd and even LAMBDA manipulators change function; the odd set supports and the even set drives the object one unit to the right. Continuing this mode of operation causes the supported module to continue to traverse to the right. FIGS. 3d through 3g illustrate two methods of the control of the motors 44a through 44p in conjunction with the manipulators.

A four-phase pushing-forward motion is shown in FIGS. 3d–3h and 3m. The tip 40a of the manipulator can be designed to make a motion to move the object 14 from left to right in a relatively up position, move down, and then move right to left in a down position, move up and repeat the motion in a closed curve in the plane of the mechanism. Again, this mode of motion is a Right or R-motion. Its reflection gives a Left or L-motion.

The other approach, called three-phase lifting motion and shown in FIGS. 3i, 3j, 3k and 3l and 3n, moves the tip 40a to the center in an up position, retracts the main beam 34a in a relatively low position and then retracts the secondary beam 46a to a down position and, similarly, repeats in a closed curve. The motion, on the other hand, generates a Left motion or L-motion. Similarly, its reflection gives a Right or R-motion.

The three-phase "lift" motion can translate any object 14 even if the tip 40a of the LAMBDA manipulator 30a is rough enough to push the object 14. In other words, the friction coefficient between the tip 40a of the LAMBDA manipulator 30a and the surface of the object 14 is not a significant factor for the motion. The throw and efficiency of the translation are sensitive to the length of the two beams 34a and 46a of the manipulator 30a. The maximum throw is the maximal displacement of the tip 40a of the LAMBDA manipulator 30a in each cycle of operation. The speed is the throw of the object 14 in each cycle. The efficiency is the speed divided by two times the maximum throw, because the object 14 can be translated at most two times of the maximum throw in each cycle. Given the fixed lengths of the main beams 34a and secondary beams 46a, the speed of the gait monotonically increases as the phase difference increases up to one hundred eighty degrees.

When the phase difference is fixed at one hundred eighty degrees, the speed increases as the length ratio of main beam 34a to the secondary beam 46a becomes larger. Efficiency, however, monotonically decreases due to the larger maximal throw. When the lengths of the main beam 34a and the secondary beam 46a are equal, and $\phi$ is one hundred eighty degrees, the efficiency is almost one hundred per cent.

The efficiency of the four-phase "pushing forward" motion, on the other hand, is only slightly affected by the length of the main beam 46a of the manipulator 30a; the object 14 is simply translated by half of the motor excursion per cycle. Maximum efficiency is achieved when the neighbor LAMBDA manipulators are operated in opposite phases. Unlike the complexity in operating the three-phase design, the four-phase design may operate two adjacent manipulators one hundred eighty degrees out of phase to maximize the throw. Maximum throw is limited by excursion due to the base motors 36a and 36b in that base motors 36a and 36b provide limited positional capability, and maximum capability is dictated by mechanical stops in the base motors. For both the three phase and four phase gait designs, a small beam length difference provides greater force at the tip 40a and better arm stiffness. Both of the designs are optimal when the length difference is minimized. The throws of the two designs are approximately equal when the phase is one hundred eighty degrees. Considering the one hundred twenty degree phase difference, which is easily met for three-phase design, the throw of the three-phase design in each cycle is larger than the four-phase design when the length ratio of the main beam 34a to the secondary beam 46a is larger than 5:2. If the stiffness of the longer arm would not cause any problem, then the three-phase design will have larger throw when the length ratio of the beams is increased.

A sensorless manipulator system, as demonstrated herein, can translate and orient a part in a variety of ways under program control. The functionality of the work bench can be, for instance, applied to the chip-positioning in a multi-chip module; the advantage is that the assembly job can be operated in parallel if well scheduled.

Figure 4:
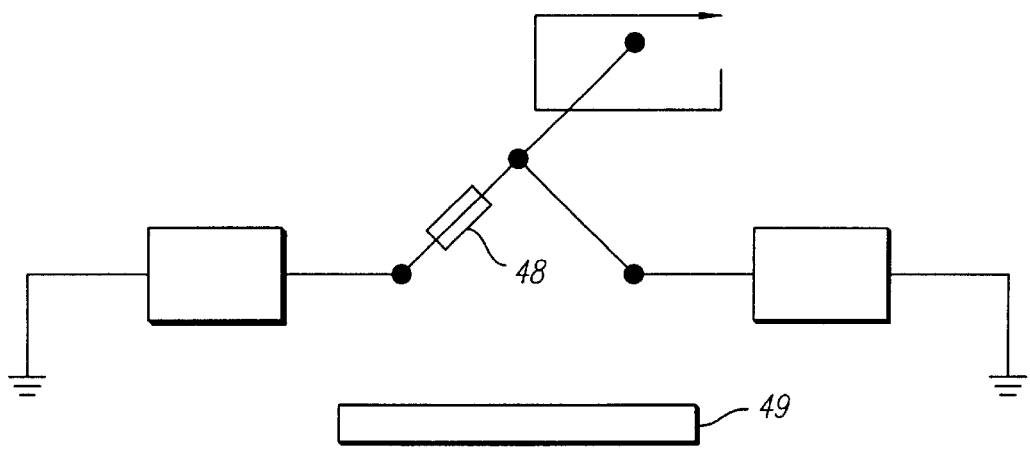
FIG. 4 is an automated version of the LAMBDA manipulator providing feedback control for the system.

However, an open loop control scheme does not keep track of the location of the object 14 placed on the surface 10 and will cause difficulty and inefficient operation in controlling objects for complicated automatic assembly applications. While the ability to orient an object 14 is attainable, as outlined above, it is generally difficult to predict when the object 14 is at the destination position, and whether it is rotated well enough for further assembly work. This difficulty could be avoided by operator intervention in a manual-assist mode, but further capability may be necessary for automatic operation. As shown in FIG. 4, the easiest addition to attain total automatic operation of the second hardware embodiment would be to add a sensor 48 to the elements of each cell 12(1) through 12(n); e.g. a strain gauge on the main beam 34a or a photocell 49 on the base of each cell 12(1) through 12(n). The sensor 48 would detect the presence of an object 14 in contact with or occluding a cell 12(1) through 12(n). The main controller 29 provides the control to the system, and thus the entire system operated in conjunction with sensor 48 or photocell 49 would provide feedback control for the system.

Figure 5A:
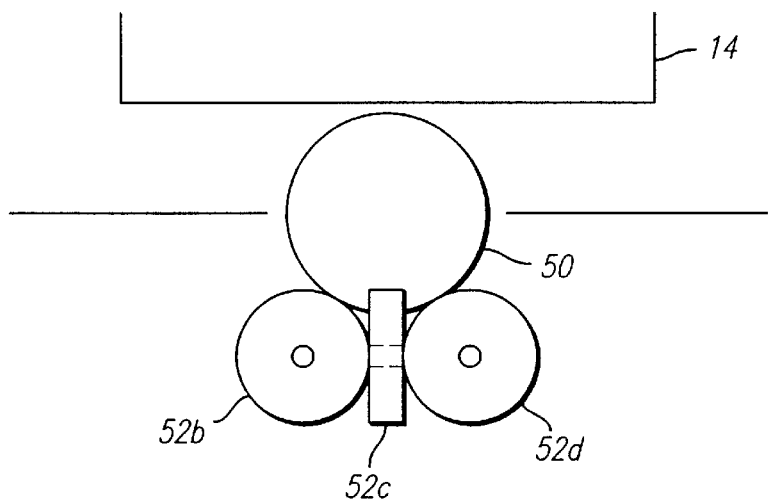
FIG. 5 shows a ball bearing embodiment of the intelligent motion surface.
Figure 5B:
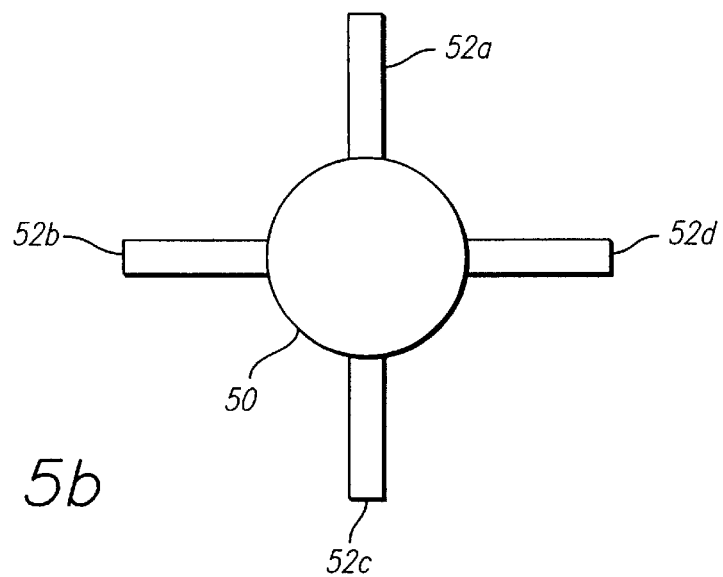

A third hardware embodiment includes the plurality of controllable cells outlined above, with an individual cell as shown in FIG. 5. FIG. 5 illustrates a ball bearing 50, with four individual wheels 52a through 52d which provide movement to the bearing when individually activated. Ball bearing 50 is suspended so as to be freely controllable from below. Application of the apparatus depicted in FIG. 5 is for packages or other relatively large objects, but may be used for smaller or larger objects. Each individual wheel 52a through 52d is individually controlled, and north wheel 52a operating so as to roll away from ball bearing 50 yields movement of the ball bearing 50 in a downward direction while south wheel 52c operates to roll toward ball bearing 50. The gaits and coordination of movement described above are unnecessary to this hardware embodiment, as surface or tip height is not controlled as with the two previous hardware embodiments. Thus operation of every other ball bearing on the surface 10 provides no distinct advantage, as this hardware embodiment utilizes only frictional properties and not kinematic properties to move the object 14. As with the other hardware embodiments, additional control surfaces may be provided for greater control over the ball bearing 50 depending on the application involved and the need for precise control. Additional wheels may be provided in the northeast, northwest, southeast and southwest corners below the ball bearing 50.

Figure 6:
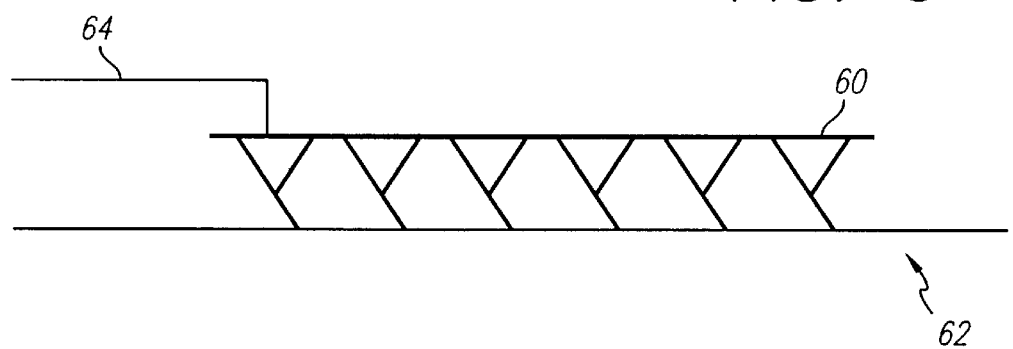
FIG. 6 is an inverted motion device embodying the teachings of the current invention.

In a fourth hardware embodiment, illustrated in FIG. 6, an inverted version of the intelligent motion surface 10 consisting of multiple cells 12(1) through 12(n) operates as an inverted motion device 60 and is controlled over a surface 62. Power and control applied to the individual cells, which may be used to carry an object in dangerous environments. As illustrated in the first and second hardware embodiments, individual control of the cells and gaits are necessary to effectuate movement. However, control of the surface elements in the fourth hardware embodiment is generally in a single direction, such that if movement of the inverted motion device 60 in a forward direction is desired, all unitary motion surfaces will be directed backward in the coordinated gaits described above. Power and control are provided externally through input line 64. Note that although a LAMBDA manipulator is illustrated in FIG. 6, the surface components shown in the first hardware embodiment or other electromechanically or mechanically moveable surfaces may be employed to operate this fourth hardware embodiment.

A fifth hardware embodiment contemplates utilizing the teachings of air currents as shown in the prior art with the programmable software technology as taught herein. For this embodiment, several individual vents may be located in each cell, all vents blowing inward or outward in different directions depending on the size of the object 14 and the necessary task, or a single, controllable air vent may be utilized to direct airflow in one of the four desired directions at a time.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains. It should be understood by those skilled in the art that various modifications, adaptations and alternative hardware and software embodiments of the intelligent motion surface of the present invention may be made within the scope and spirit of the present invention, which is defined by the following claims.

What is claimed is:

1. An intelligent motion surface for transporting at least one object over a surface, comprising:

a plurality of independently controllable force producing devices for moving the object multidirectionally and parallel to the surface;

a plurality of driving devices, said driving devices engaging said controllable force producing devices for independently operating each of said force producing devices, wherein each driving device causes each force producing device to operate in a separate direction;

definition means for defining at least one force area on the intelligent motion surface based on object shape, object size, and desired position of the object on the intelligent motion surface; and programming means for translating the force areas established by the definition means to produce a desired force vector over the intelligent motion surface, wherein force applied to the driving devices and controllable force producing devices located within the force areas produces movement of at least one object in a desired direction;

wherein said independently controllable force producing devices each comprise:

a main beam having a main beam base and a tip located thereon;

a secondary beam having a secondary beam base thereon, wherein said secondary beam adjoins said main beam at a pivot point located along said main beam;

a main base joint pivotally attached to said main beam base; and a secondary beam joint pivotally attached to said secondary beam base; and wherein said beam joints are linearly driven by said driving devices, and motion of said beam joints operates said main beam and said secondary beam thereby moving said tip in a curvilinear direction.

2. The intelligent motion surface of claim 1, wherein said driving devices are two controllable mechanisms, each producing a linear force, wherein the first controllable mechanism is affixed to said main beam joint and the second controllable mechanism is affixed to said secondary beam joint.

3. An intelligent motion surface for transporting at least one object over a surface, comprising:

a plurality of independently controllable force producing devices for moving the object multidirectionally and parallel to the surface;

a plurality of driving devices, said driving devices engaging said controllable force producing devices for independently operating each of said force producing devices, wherein each driving device causes each force producing device to operate in a separate direction;

definition means for defining at least one force area on the intelligent motion surface based on object shape, object size, and desired position of the object on the intelligent motion surface; and programming means for translating the force areas established by the definition means to produce a desired force vector over the intelligent motion surface, wherein force applied to the driving devices and controllable force producing devices located within the force areas produces movement of at least one object in a desired direction;

wherein said force producing device comprises a pivotable planar surface element hinged at an edge of said element for pivotal motion away from said surface of said intelligent motion surface.

4. The intelligent motion surface of claim 3, wherein said pivotable planar surface element comprises an air cored coil wound within said pivotable planar surface such that when force is applied from the programming means a magnetic field is created and the pivotable planar surface rises away from the surface.

5. The intelligent motion surface of claim 4, further comprising an electromagnet beneath the intelligent motion surface to provide the magnetic field to the pivotable planar surface.

6. An intelligent motion surface for transporting at least one object over a surface, comprising:

a plurality of independently controllable force producing devices for moving the object multidirectionally and parallel to the surface;

a plurality of driving devices, said driving devices engaging said controllable force producing devices for independently operating each of said force producing devices, wherein each driving device causes each force producing device to operate in a separate direction;

definition means for defining at least one force area on the intelligent motion surface based on object shape, object size, and desired position of the object on the intelligent notion surface; and programming means for translating the force areas established by the definition means to produce a desired force vector over the intelligent motion surface, wherein force applied to the driving devices and controllable force producing devices located within the force areas produces movement of at least one object in a desired direction;

wherein said force producing device comprises a ball bearing and said driving devices are centrally mounted rotational devices located beneath said ball bearing.

7. An intelligent motion surface for moving at least one object over a surface to attain a desired position, comprising:

a plurality of independently controllable motion cells, each motion cell providing at least one direction of control for the object, comprising:

at least one force producing device capable of providing motion of the object in at least one direction; and at least one surface driving mechanism, said surface driving mechanism operating one force producing device in the cell in response to commands received from a motion controller; and a main controller for calculating operation of each cell based on the desired position of the object;

wherein the main controller comprises:

definition means for delineating at least one force area on the intelligent motion surface based on object shape, object size, and desired position of the object on the intelligent motion surface; and programming means for translating the force areas established by the definition means to produce a desired force vector over the intelligent motion surface, wherein force applied to the plurality of independently controllable cells located within the force areas produces movement of at least one object in a desired direction; and wherein each force producing device comprises a lambda manipulator.

8. An intelligent motion surface for moving at least one object over a surface to attain a desired position, comprising:

a plurality of independently controllable motion cells, each motion cell providing at least one direction of control for the object, comprising:

at least one force producing device capable of providing motion of the object in at least one direction; and at least one surface driving mechanism, said surface driving mechanism operating one force producing device in the cell in response to commands received from a motion controller; and a main controller for calculating operation of each cell based on the desired position of the object;

wherein the main controller comprises:

definition means for delineating at least one force area on the intelligent motion surface based on object shape, object size, and desired position of the object on the intelligent motion surface; and programming means for translating the force areas established by the definition means to produce a desired force vector over the intelligent motion surface, wherein force applied to the plurality of independently controllable cells located within the force areas produces movement of at least one object in a desired direction; and wherein said force producing device comprises:

a main beam having a main beam base and a tip located thereon;

a secondary beam having a secondary beam base thereon, wherein said secondary beam adjoins said main beam at a pivot point located along said main beam;

a main base joint pivotally attached to said main beam base; and a secondary beam joint pivotally attached to said secondary beam base;

wherein said beam joints are linearly driven by said driving devices, and motion of said beam joints operates said main beam and said secondary beam thereby moving said tip in a curvilinear direction.

9. An intelligent motion surface for moving at least one object over a surface to attain a desired position, comprising:

a plurality of independently controllable motion cells, each motion cell providing at least one direction of control for the object, comprising:

at least one force producing device capable of providing motion of the object in at least one direction; and at least one surface driving mechanism, said surface driving mechanism operating one force producing device in the cell in response to commands received from a motion controller; and a main controller for calculating operation of each cell based on the desired position of the object;

wherein the main controller comprises:
definition means for delineating at least one force area on the intelligent motion surface based on object shape, object size, and desired position of the object on the intelligent motion surface; and
programming means for translating the force areas established by the definition means to produce a desired force vector over the intelligent motion surface, wherein force applied to the plurality of independently controllable cells located within the force areas produces movement of at least one object in a desired direction;
wherein said surface driving mechanism is a controllable motor producing a linear force, and each controllable motor is affixed to a beam joint.

10. An intelligent motion surface for moving at least one object over a surface to attain a desired position, comprising:
a plurality of independently controllable motion cells, each motion cell providing at least one direction of control for the object, comprising:
at least one force producing device capable of providing motion of the object in at least one direction;
at least one surface driving mechanism, said surface driving mechanism operating one force producing device in the cell in response to commands received from a motion controller; and
a main controller for calculating operation of each cell based on the desired position of the object;
wherein the main controller comprises:
definition means for delineating at least one force area on the intelligent motion surface based on object shape, object size, and desired position of the object on the intelligent motion surface; and
programming means for translating the force areas established by the definition means to produce a desired force vector over the intelligent motion surface, wherein force applied to the plurality of independently controllable cells located within the force areas produces movement of at least one object in a desired direction;
wherein each force producing device in each cell is equiangularly displaced from the adjacent force producing devices in the cell; and
wherein said force producing device comprises a pivotable planar surface element hinged at an edge of said element for pivotal motion away from said surface of said intelligent motion surface.

11. The intelligent motion surface of claim 10, wherein said pivotable planar surface element comprises an air cored coil wound within said pivotable planar surface element such that when power is applied from a motion controller a magnetic field is created and the pivotable planar surface element rises away from the surface of the intelligent motion surface.

12. The intelligent motion surface of claim 10, further comprising an electromagnet beneath the cells to provide the magnetic field to the pivotable planar surface element.

13. An intelligent motion surface for moving at least one object over a surface to attain a desired position, comprising:
a plurality of independently controllable motion cells, each motion cell providing at least one direction of control for the object, comprising:
at least one force producing device capable of providing motion of the object in at least one direction; and
at least one surface driving mechanism, said surface driving mechanism operating one force producing device in the cell in response to commands received from a motion controller; and
a main controller for calculating operation of each cell based on the desired position of the object;
wherein the main controller comprises:
definition means for delineating at least one force area on the intelligent notion surface based on object shape, object size, and desired position of the object on the intelligent motion surface; and
programming means for translating the force areas established by the definition means to produce a desired force vector over the intelligent motion surface, wherein force applied to the plurality of independently controllable cells located within the force areas produces movement of at least one object in a desired direction;
wherein each force producing device in each cell is equiangularly displaced from the adjacent force producing devices in the cell; and
wherein said force producing device comprises a bail bearing and said driving devices are centrally mounted rotational devices located beneath said ball bearing.

14. An inverted motion device capable of movement over a substantially level plane in a desired direction, comprising:
(a) a plurality of motion cells, each motion cell comprising:
at least one independently controllable force producing device capable of providing motion of the object in at least one direction;
a motion controller for independently operating each of said controllable force producing devices to move the inverted motion device;
at least one surface driving mechanism for operating one force producing device in the cell in response to commands received from said motion controller; and
(b) a main controller for translating the desired movement over the level plane into commands for each of the motion controllers;
wherein each cell comprises a pivotable planar surface element hinged at an edge of said element for pivotal motion away from said motion device.

15. The inverted motion device of claim 14, wherein said pivotable planar surface element comprises an air cored coil wound within said pivotable planar surface such that when power is applied from the motion controller a magnetic field is created and the pivotable planar surface moves away from said inverted motion device.

16. The inverted motion device of claim 15, further comprising an electromagnet to provide the magnetic field to the pivotable planar surface.

17. The inverted motion device of claim 16, wherein said surface driving mechanism is a controllable motor producing a linear force, and wherein each surface driving mechanism is affixed to a beam joint.

18. An inverted device capable of movement over a substantially level plane in a desired direction, comprising:
(a) a plurality of motion cells, each motion cell comprising:
at least one independently controllable force producing device capable of providing motion of the object in at least one direction;
a motion controller for independently operating each of said controllable force producing devices to move the inverted motion device; and
at least one surface driving mechanism for operating one force producing device in the cell in response to commands received from said motion controller; and (b) a main controller for translating the desired movement over the level plane into commands for each of the motion controllers;

wherein each independently controllable force producing device comprises:
- a main beam having a main beam base and a tip located thereon;
- a secondary beam having a secondary beam base thereon, wherein said secondary beam adjoins said main beam at a pivot point located along said main beam;
- a main base joint pivotally attached to said main beam base; and
- a secondary beam joint pivotally attached to said secondary beam base;
    - wherein said beam joints are linearly driven by said driving devices, and motion of said beam joints operates said main beam and said secondary beam thereby moving said tip in a curvilinear direction.

19. The inverted motion device of claim 18, wherein the main controller comprises:
- definition means for defining at least one force area on the inverted motion device based on desired position of the motion device on the level plane; and
- programming means for translating the force areas established by the definition means to produce a desired force vector over the substantially level plane, wherein force applied to the driving devices and controllable force producing devices located within the force areas produces movement of the inverted motion device in a desired direction.

20. An intelligent motion surface for transporting at least one object over a surface, comprising:
- a plurality of independently controllable force producing devices for moving the object multidirectionally and substantially parallel to the intelligent motion surface;
- a plurality of driving devices, said driving devices engaging said force producing devices for independently operating each of said force producing devices, wherein each driving device propels the force producing device in a different direction; and
- a motion controller for independently operating each of said plurality of driving devices and operating said force producing devices to move at least one object to a desired position parallel to the surface;
- wherein said motion surface comprises a lambda manipulator.

21. An intelligent motion surface for transporting at least one object over a surface, comprising:
- a plurality of independently controllable force producing devices for moving the object multidirectionally and substantially parallel to the intelligent motion surface;
- a plurality of driving devices, said driving devices engaging said force producing devices for independently operating each of said force producing devices, wherein each driving device propels the force producing device in a different direction; and
- a motion controller for independently operating each of said plurality of driving devices and operating said force producing devices to move at least one object to a desired position parallel to the surface;
- wherein said force producing device comprises:
    - a main beam having a main beam base and a tip located thereon;
    - a secondary beam having a secondary beam base thereon, wherein said secondary beam adjoins said main beam at a pivot point located along said main beam;
    - a main base joint pivotally attached to said main beam base; and
    - a secondary beam joint pivotally attached to said secondary beam base;
        - wherein said beam joints are linearly driven by said driving devices, and motion of said beam joints operates said main beam and said secondary beam thereby moving said tip in a curvilinear direction.

22. An intelligent motion surface for transporting at least one object over a surface, comprising:
- a plurality of independently controllable force producing devices for moving the object multidirectionally and substantially parallel to the intelligent motion surface;
- a plurality of driving devices, said driving devices engaging said force producing devices for independently operating each of said force producing devices, wherein each driving device propels the force producing device in a different direction; and
- a motion controller for independently operating each of said plurality of driving devices and operating said force producing devices to move at least one object to a desired position parallel to the surface;
- wherein said driving devices are two controllable mechanisms each producing a linear force, wherein the first controllable mechanism is affixed to a main beam joint and the second controllable mechanism is affixed to a secondary beam joint.

23. An intelligent motion surface for transporting at least one object over a surface, comprising:
- a plurality of independently controllable force producing devices for moving the object multidirectionally and substantially parallel to the intelligent motion surface;
- a plurality of driving devices, said driving devices engaging said force producing devices for independently operating each of said force producing devices, wherein each driving device propels the force producing device in a different direction; and
- a motion controller for independently operating each of said plurality of driving devices and operating said force producing devices to move at least one object to a desired position parallel to the surface;
- wherein said force producing device comprises a pivotable planar surface element hinged at an edge of said element for pivotal motion away from said surface of said intelligent motion surface.

24. The intelligent motion surface of claim 23, wherein said pivotable planar surface element comprises an air cored coil wound within said pivotable planar surface such that when power is applied from the motion controller a magnetic field is created and the pivotable planar surface rises away from the surface of the intelligent motion surface.

25. The intelligent motion surface of claim 23, further comprising an electromagnet beneath the cells to provide the magnetic field to the pivotable planar surface.

26. An intelligent motion surface for transporting at least one object over a surface, comprising:
- a plurality of independently controllable force producing devices for moving the object multidirectionally and substantially parallel to the intelligent motion surface;
- a plurality of driving devices, said driving devices engaging said force producing devices for independently operating each of said force producing devices, wherein each driving device propels the force producing device in a different direction; and
- a motion controller for independently operating each of said plurality of driving devices and operating said force producing devices to move at least one object to a desired position parallel to the surface;

wherein said force producing device comprises a ball bearing and said driving devices are centrally mounted rotational devices located beneath said ball bearing and engaging therewith.

27. An intelligent motion surface for transporting at least one object over a surface, comprising:

a plurality of independently controllable force producing devices for moving the object multidirectionally and substantially parallel to the intelligent motion surface;

a plurality of driving devices, said driving devices engaging said force producing devices for independently operating each of said force producing devices, wherein each driving device propels the force producing device in a different direction;

a motion controller for independently operating each of said plurality of driving devices and operating said force producing devices to move at least one object to a desired position parallel to the surface; and a sensing device to provide feedback to the main controller when the object is located upon the cell such that automatic control of the object over the surface exists.

28. A motion control assembly, comprising:

a plurality of independently-controllable motion cells;

each of the cells including at least one force producing device;

upper surfaces of the force producing devices of the motion cells collectively defining an object-support surface;

each of the cells including at least one drive mechanism which controllably operates one of the force producing devices; and the force producing devices when operated by the drive mechanisms controllably moving an object disposed on the surface in at least one direction on the surface.

29. The system of claim 28, wherein the force producing devices each comprise a rolling unit, and the upper surfaces are upper surfaces of the rolling units.

30. The system of claim 29, wherein each of the rolling units is a ball bearing, and the drive mechanisms each comprise a centrally-mounted rotational device located beneath said ball bearing and engaging therewith.

31. An object movement system, comprising:

a plurality of actuators attached to a support surface;

tips of the actuators collectively defining an intelligent motion surface; and a control system which causes at least some of the tips to move up and down and thereby controllably move an object on the intelligent motion surface and relative to the support surface.

32. The system of claim 31, wherein the control system causes at least some of the tips to also move side to side to controllably move the object.

33. A motion control system, comprising:

a plurality of independently-controllable motion cells;

each of the cells including at least one force producing device;

upper surfaces of the force producing devices of the motion cells collectively defining an object support surface;

each of the cells including at least one drive mechanism which controllably operates one of the force producing devices; and the force producing devices when operated by the drive mechanisms controllably causing the motion control system to move relative to an object positioned on or in contact with the object support surface.

34. A motion control system, comprising:

a plurality of independently-controllable motion cells;

each of the cells including at least one force producing device;

upper surfaces of the force producing devices of the motion cells collectively defining an object support surface;

each of the cells including at least one drive mechanism which controllably operates one of the force producing devices; and the force producing devices when operated by the drive mechanisms controllably causing the motion control system to move relative to an object positioned on or in contact with the object support surface in at least one direction relative to the surface.

35. An object movement system, comprising:

a plurality of actuators attached to a base surface;

tips of the actuators collectively defining an object support surface; and a control system that causes at least some of the tips to execute a motion loop orthogonal to a plane of the object support surface.

36. The object movement system of claim 35, wherein the motion loop includes movement from a start position in an up direction, movement then in a translation direction and movement then to the start position.

37. The object movement system of claim 36, wherein the movement in the translation direction is in a forwards or backwards direction.

38. An inverted motion control device capable of movement over a substantially level plane, comprising:

a plurality of independently-controllable motion cells;

each of the motion cells including at least one force producing device;

lower surfaces of the force producing devices of the motion cells collectively defining an object support surface;

each of the cells including at least one drive mechanism which controllably operates one of the force producing devices; and the force producing devices when operated by the drive mechanisms controllably causing a relative motion of the inverted motion control device positioned so that the object support surface of the inverted motion control device contacts the substantially level plane in at least one direction relative to the substantially level plane.

39. An intelligent motion surface, comprising:

(a) a plurality of independently-controllable motion cells, surfaces of the cells collectively defining an object support surface, each of the cells providing at least one direction of control for an object on the support surface, each of the cells comprising:

at least one velocity producing device capable of providing motion to an object in at least one direction on the support surface; and at least one surface driving mechanism operating one velocity producing device in the cell in response to received commands; and (b) a main controller which calculates operation of each of the cells based on a desired position of the object on the support surface.

40. The intelligent motion surface of claim 39, wherein the main controller comprises:

definition means for delineating at least one area on the support surface based on at least one of object shape, object size, and desired position of the object on the support surface; and programming means for translating the areas established by the definition means to produce a desired velocity vector of the object over the support surface.

41. An intelligent motion surface, comprising:

a plurality of cells, surfaces of which collectively define an object support surface;

each of the cells including first and second velocity producing means for imparting a velocity to at least one object in respective first and second perpendicular directions relative to the support surface; and each of the cells including first and second operating means for operating the first and second velocity producing means independent of one another.

42. A method for controllably moving at least one object, comprising the steps of:

providing an intelligent motion surface defined by surfaces of a multitude of adjacent cells, each of the cells including first and second independently-operable motion means for moving at least one object in respective first and second desired directions relative to the intelligent motion surface; and operating selective ones of the first and second motion means of each of the cells to engage and thereby move at least one object along a desired path on the intelligent motion surface.

43. The method of claim 42, wherein the first and second desired directions are perpendicular to one another.

44. The method of claim 42, wherein the operating step is conducted according to an algorithm.

\* \* \* \* \*